United States Patent
Slafer

(10) Patent No.: US 12,127,465 B2
(45) Date of Patent: Oct. 22, 2024

(54) SYSTEMS, METHODS, AND STRUCTURES FOR OLED SUBSTRATES

(71) Applicant: MicroContinuum, Inc., Watertown, MA (US)

(72) Inventor: W. Dennis Slafer, Arlington, MA (US)

(73) Assignee: MicroContinuum, Inc., Watertown, MA (US)

( * ) Notice: Subject to any disclaimer, the term of this patent is extended or adjusted under 35 U.S.C. 154(b) by 257 days.

(21) Appl. No.: 17/649,611

(22) Filed: Feb. 1, 2022

(65) Prior Publication Data

US 2022/0246895 A1  Aug. 4, 2022

Related U.S. Application Data

(60) Provisional application No. 63/254,673, filed on Oct. 12, 2021, provisional application No. 63/144,097, filed on Feb. 1, 2021.

(51) Int. Cl.
| | |
|---|---|
| H01L 23/00 | (2006.01) |
| H10K 50/814 | (2023.01) |
| H10K 50/824 | (2023.01) |
| H10K 50/842 | (2023.01) |
| H10K 50/858 | (2023.01) |
| H10K 71/00 | (2023.01) |
| H10K 77/10 | (2023.01) |
| H10K 102/00 | (2023.01) |
| H10K 102/10 | (2023.01) |

(52) U.S. Cl.
CPC ........... *H10K 71/00* (2023.02); *H10K 50/814* (2023.02); *H10K 50/824* (2023.02); *H10K 50/8426* (2023.02); *H10K 50/858* (2023.02); *H10K 71/621* (2023.02); *H10K 77/10* (2023.02); *H10K 2102/102* (2023.02); *H10K 2102/103* (2023.02); *H10K 2102/331* (2023.02)

(58) Field of Classification Search
CPC .... H10K 71/00; H10K 50/814; H10K 50/824; H10K 71/621; H10K 50/858
See application file for complete search history.

(56) References Cited

U.S. PATENT DOCUMENTS

2019/0105938 A1* 4/2019 Holmes ................ G02B 5/1861

* cited by examiner

*Primary Examiner* — Anthony Ho
(74) *Attorney, Agent, or Firm* — Daly, Crowley, Mofford & Durkee, LLP

(57) ABSTRACT

Systems, methods, and structures for improving the performance of thin-film electronic devices, in particular organic LEDs (OLEDs) used in lighting, are disclosed. Enhanced substrates, upon which OLED devices may be deposited, incorporate various structures for extracting light trapped in the device stack and substrate. The substrates provide an improved transparent electrode layer. Methods for forming planarized buried extraction structures to reduce disruption to the deposited device stack layers are disclosed, as are methods for providing smooth, planarized buried metal mesh conductors.

21 Claims, 19 Drawing Sheets

SYSTEMS, METHODS, AND STRUCTURES FOR OLED SUBSTRATES

CROSS REFERENCE TO RELATED APPLICATIONS

This application claims priority to and the benefit of (i) U.S. Provisional Patent Application No. 63/144,097, filed 1 Feb. 2021 and entitled "Methods for Producing Improved OLEDS and Electronic Devices, and (ii) U.S. Provisional Patent Application No. 63/254,673, filed 12 Oct. 2021 and entitled" "Systems and Methods for Improved OLED Substrates"; the entire content of each of these referenced applications is incorporated herein by reference.

BACKGROUND

Organic light emitting diodes (OLEDs) offer a number of potential benefits in lighting for industrial, commercial, and residential applications: ultra-thin, lightweight, flexible, large-area panels that produce soft lighting for very comfortable direct viewing. Because of the intrinsic nature of OLED layers as a uniform emissive source, the promise of OLED lighting is the ability to cover large surfaces (walls, columns, etc.) with a dimmable and color-adjustable film that eliminates the harshness of point-source lighting. Transparent versions can also be used over windows to let light in by day and provide lighting by night.

Despite the potentially significant benefits of OLED lighting, key technical and cost limitations continue to hamper the widespread adoption of OLED solid-state lighting (SSL), and these include low output efficiency, poor light output uniformity, extreme sensitivity to moisture and oxygen, and—most significantly—high manufacturing costs. Each of these elements is described in further detail below.

One limitation of OLEDs has been output efficiency. OLED molecules can be extremely efficient in turning electricity into light, and the measure of this, internal quantum efficiency (IQE), can reach nearly 100%. However, only a small amount of this light is actually emitted from the device due to light trapping, which results from two main causes: trapping in the waveguide mode formed by the refractive index differences of the OLED layers ("internal trapping") and trapping in the substrate due to total internal reflection (TIR) at the substrate-air interface ("external trapping"). Thus, the measure of the efficiency of photons reaching the outside world, the external quantum efficiency (EQE), is only ~20%. This represents a very significant loss of potential device efficiency.

Another limitation of OLEDS has been poor emission uniformity. This arises from the limitations of the transparent conductor electrode layer. To date, the standard solution has been to use a layer of transparent conductive oxide (TCO) material, typically indium tin oxide (ITO), even though it has a number of drawbacks. As discussed below, none of the common alternative transparent conductor (TC) materials have been able to meet the requirements for a low-cost, high performance, large area transparent electrode layer.

A well-known problem with ITO is the tradeoff between conductivity, optical transmissivity, and physical properties. To achieve good electrical conductivity (<100Ω/square for sheet resistance), the layer must be thick, but as ITO becomes thicker it also becomes less transparent and reducing light output. Furthermore, the surface of ITO also becomes increasingly rough with increasing thickness. Increased roughness can produce shorting within the device stack due to disruptions to the precise uniformity of the thin component layers. Thick layers of ITO are also brittle, leading to crazing, cracking, and adhesion failure with flexible substrates. The vacuum deposition process for thick ITO is also very slow, which adds to the manufacturing costs of the device.

Achieving good electrical conductivity and optical transmissivity while maintaining useable physical properties with ITO is problematic. Alternative materials also have their own issues: carbon nanotubes (CNTs) are relatively poor electrical conductors and exhibit low optical transmission when coated thickly enough to achieve the required conductivity. Graphene is difficult and expensive to apply, particularly in large areas, and its optical transmission is reduced in thicker layers. Silver nanowires and metallic inks applied by graphic arts techniques require post processing to achieve acceptable conductivity but do not approach the performance of the corresponding bulk metals. In order to achieve useful levels of performance, post-processing of conductive inks is typically required to anneal the printed lines, usually by high-power pulsed laser, flash lamp, or thermal source, which can be deleterious to devices, particularly to plastic substrates.

As OLEDs are current-driven devices, the effects of poor TC conductivity are exacerbated over large areas, where resistance losses reduce light output across the device and result in non-uniform emission and wasteful conversion of applied power into heat.

OLEDS have also presented limitations regarding barrier coating and encapsulation. For example, OLEDs are very susceptible to exposure to moisture and oxygen, which result in severe and often rapid device degradation. That susceptibility presents a significant challenge to the long-term stability of OLED devices. Due to the intrinsically high moisture and oxygen transmission rates of polymer films, substrates made from these materials have been unacceptable for OLED applications. Although a significant amount of work has been carried out in developing moisture and oxygen barriers for plastic films, these materials are not commercially viable due to general lack of availability and extremely high costs. Thus, glass substrates (rigid or flexible) are typically used for commercial OLED manufacturing.

While glass substrates (and potentially barrier films) are designed to prevent water and oxygen ingress from the substrate side of the device, encapsulation is required to seal all other exposed device surfaces. Epoxy encapsulation has been a standard solution for top/side sealing in OLED devices, however, a moisture/oxygen leakage issue commonly arises when attempting to incorporate polymer-based internal light extraction structures into these devices, as any polymeric structure extending through the encapsulant-substrate seal present a moisture/oxygen pathway to device degradation. This has, to date, limited the acceptance by panel manufacturers of polymeric light extraction structures in OLED devices.

Although OLEDs deposited on patterned surfaces have been shown by many research facilities to increase light output efficiency, the devices can suffer from problems such as shorts and non-uniform emission that can arise from deposition on non-planar surfaces. In addition, OLED panel manufacturers have developed manufacturing processes based on smooth, planar substrates and prefer such surfaces in order to avoid potential yield losses and the additional costs of implementing extraction features into established processes. Thus, corrugated-type substrate surfaces, despite their benefit in improved efficiency, present a manufacturing challenge.

A number of approaches to light extraction have been developed, including use of surface corrugations, scattering centers, refractive index control, buried optics, microlens arrays, etc. Solutions afforded by such approaches are, however, expensive to implement. For example, while periodic 3D structures with nano- and microscale features have been used effectively to extract waveguide-trapped light in OLEDs, conventional lithographic processes used to make such structures can be prohibitively expensive and slow, particularly on a substrate-by-substrate basis. Multi-beam laser interferometry can make periodic patterns in significantly less time but is complex and time-consuming to set up and align, in particular to stabilize the interference fringes for the long exposure times needed to produce large area patterns.

For external light extraction (i.e., at the substrate-air interface), microlens arrays ("MLA"s or "μLA"s) are commonly used but expensive, even for small areas, and not a cost-effective solution for large scale production. Another significant cost is that of the transparent conductor, typically ITO, as discussed above. For flexible OLEDs on plastic films, the incorporation of a high-performance barrier-coating is of critical importance, and this very expensive component further adds to the overall high cost of OLED lighting devices.

Thus, the multiple challenges to the prior art described above have a significant negative impact on the development of high efficiency OLED lighting panels. What is needed, therefore, are commercially viable structure, systems, and methods to enable improvements in the efficiency and performance of OLED lighting and other thin-film devices that better allow the advantages of OLEDs to be realized.

SUMMARY

The present disclosure describes new and improved structures, systems, and methods for producing substrates incorporating corrugated light extraction surfaces and metal mesh transparent conductors as features for improving OLED performance. Embodiments are also directed to OLED substrates and structures themselves.

Exemplary embodiments of the systems, methods, and structures according to the present disclosure overcome the shortcomings of the prior art by providing substrates with one or more structures that increase device light-output efficiency and uniformity with increased environmental stability.

One aspect of the present disclosure is directed to and provides improved methods of forming a planar substrate with a buried light extraction structure for fabricating OLEDs.

Another aspect of the present disclosure is directed to and provides new OLED substrate structures having both a planar metal mesh transparent conductor and buried extraction structure.

A further aspect of the present disclosure is directed to and provides a new structure having both buried and surface extraction patterns. Exemplary embodiments include such structures with a buried metal mesh transparent conductor.

An additional aspect of the present disclosure is directed to and provides methods for forming metal patterns having very smooth surfaces.

A further aspect of the present disclosure is directed to and provides methods for forming metal mesh transparent conductive layers that reduce or eliminate unwanted diffraction and/or glint effects.

The various structures, methods, and systems of the present disclosure can be applied to batch or roll production of these materials. Further, while these methods and systems use OLED formation for most examples, it should be noted that they can also be used beneficially for other thin-films devices, including but not limited to the areas of photovoltaics, sensors, electronics.

A further aspect of the present disclosure is directed to and provides substrates that integrate light extraction features and a novel transparent conductive (TC) layer to provide enhanced working substrates for OLED panel manufacturing while incorporating process design flexibility to accommodate future improvements in light extraction and transparent conductors.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principles of the concepts described herein. Like reference numerals designate corresponding parts throughout the different views. Furthermore, embodiments are illustrated by way of example and not limitation in the figures, in which.

DETAILED DESCRIPTION

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

Aspects of the present disclosure are directed to novel systems, methods, and structures for producing improved working substrates for OLED fabrication and devices as well as OLED substrates and structures themselves.

Exemplary embodiments of the present disclosure include a "donor-receiver" process for forming an enhanced substrate for OLED deposition in which the donor component is a film with a release surface on which various components of the light extraction and/or metal mesh structures are formed for subsequent transfer to a receiver component, the latter being a substrate to which these structures are transferred for subsequent OLED deposition and finishing. The enhanced substrate is the receiver substrate including a planar light extraction structure, an external light extraction structure, and a metal mesh transparent conductor layer. It has been shown that forming a periodic relief pattern (such as the light extraction patterns discussed herein) in a low refractive index ("RI") material, such as glass, and planarizing this structure with a transparent high RI material, results in the diffraction of light, although less efficiently than if the diffractive structure were in air. This is because it is known that the efficiency of a periodic grating depends on the difference in RI between the structure and the medium that surrounds it, as well as the depth of the periodic structure. Therefore, as the difference in RI between the relief structure and its surrounding medium decreases, or as the depth of the relief structure decreases, the diffraction efficiency, i.e., the amount of light going into the various orders of diffraction relative to the un-diffracted light, also decreases. Therefore, to obtain maximum light extraction from a buried diffracting structure, the RI difference and the depth of the structure (or aspect ratio for a given periodicity) should both be maximized. A flow chart summarizing the steps of an example of such a process is given in FIG. 1.

Figure 1:
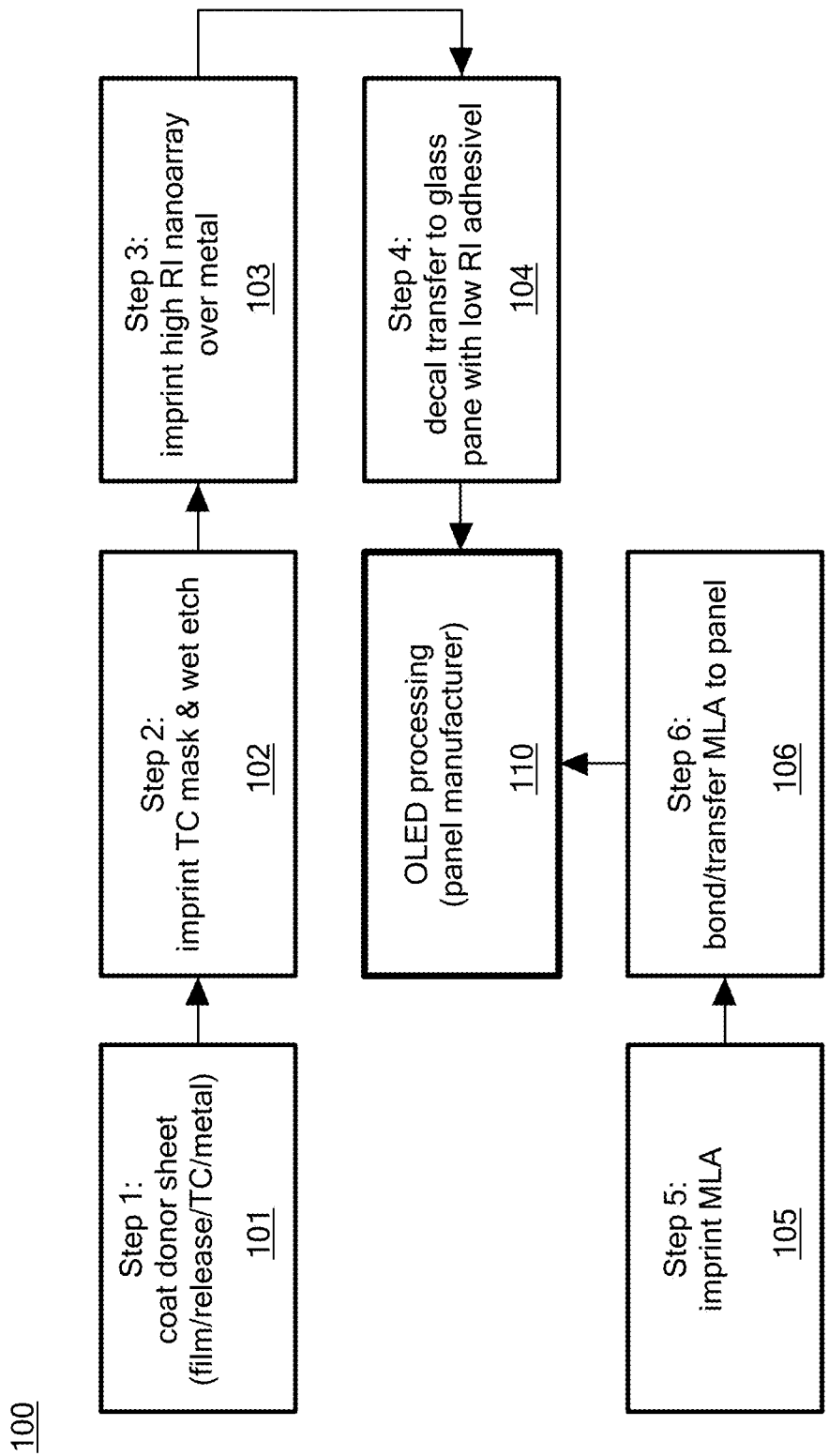
FIG. 1 shows the process flow for an exemplary formation process for an enhanced substrate with a planar buried extraction structure and metal mesh transparent conductor, in accordance with the present disclosure.

In FIG. 1, process 100 begins at Step 1 with donor sheet 101, a flexible polymeric film onto which one or more layers are deposited. In exemplary embodiments, the layers can be continuous and/or non-patterned. These layers can include a first release layer, a second thin transparent conductive layer, and a top metal layer. Such a second layer (i.e., thin transparent conductive layer) is optional. For example, the donor sheet may be a polyester or other plastic roughly in the range of 1 to 5 mils (25 to 125 microns] in thickness, the thin release layer being PTFE (Teflon®) or the like, roughly <10 nm thick, the optional continuous conductor being a thin transparent conductive oxide such as ITO or other TC material roughly submicron in thickness (depending on material), and the top conductive layer being Cu, Al or other metal, typically less than 100 nm in thickness.

In Step 2 (102), a polymer resist mask is formed on the top metal layer by nanoimprinting through a semitransparent imprint drum using UV exposure. Suitable imprint drums are described in Applicant's co-owned U.S. Pat. Nos. 10,759,095, 10,505,268, 10,135,031, and 9,985,248, the contents of all of which patents are incorporated herein by reference in their entireties. This is followed by removal of the unexposed polymer residue by solvent, then an aqueous metal etch step that removes all metal exposed through the openings of the resist mask and stops at the continuous conductor layer. The etch process is quenched in a neutralization bath, followed by rinsing and drying of the film. This process produces high-resolution metal lines having widths ranging from tens of microns to less than 1 micron and line thickness from a few nanometers to hundreds of nanometers and eliminates the need for prohibitively high-cost and time-consuming plasma (vacuum) etching.

Next, Step 3 (103) is carried out in which a 3D relief extraction pattern having nanometer to multi-micron features is formed by UV nanopatterning a high refractive index ("high RI") transparent polymer layer, e.g., having an RI of approximately 1.6 or greater, coated on the patterned metal. In Step 4 (104), a low refractive index adhesive, e.g., having a refractive index approximately 1.5 or less, is used to bond the donor sheet to the receiving substrate (flexible or rigid glass or barrier-coated plastic). After curing, the laminate is separated at the release layer of the donor film, producing a receiver (or second) substrate including a planar surface having a surface roughness that mirrors that of the donor (or first) substrate and with a continuous conductor top layer, directly under which is a transparent metal mesh pattern buried in the high RI 3D relief pattern, which in turn is bonded to the receiver substrate by a low RI UV adhesive that conforms to the 3D relief pattern of the high RI layer. The "interlocked" high RI/low RI pattern thus forms a "buried" internal light extraction structure. In Step 5 (105), another 3D relief structure (e.g., a microlens array, moth-eye antireflection structure, or other pattern) used for extracting light trapped in the substrate is formed on the air (emission) side of the receiving substrate, thereby completing the enhanced OLED substrate. Modification to the elements of this method can be made to accommodate process variants, such as applying the external extraction layer before or after completion of the OLED device.

Although the structures shown herein illustrate OLED devices that emit from the transparent substrate (bottom emission), it is an aspect of the present disclosure that similar methods and structures may also be used to fabricate extraction structures for OLEDs in which the stack is reversed (top emission).

Figure 2:
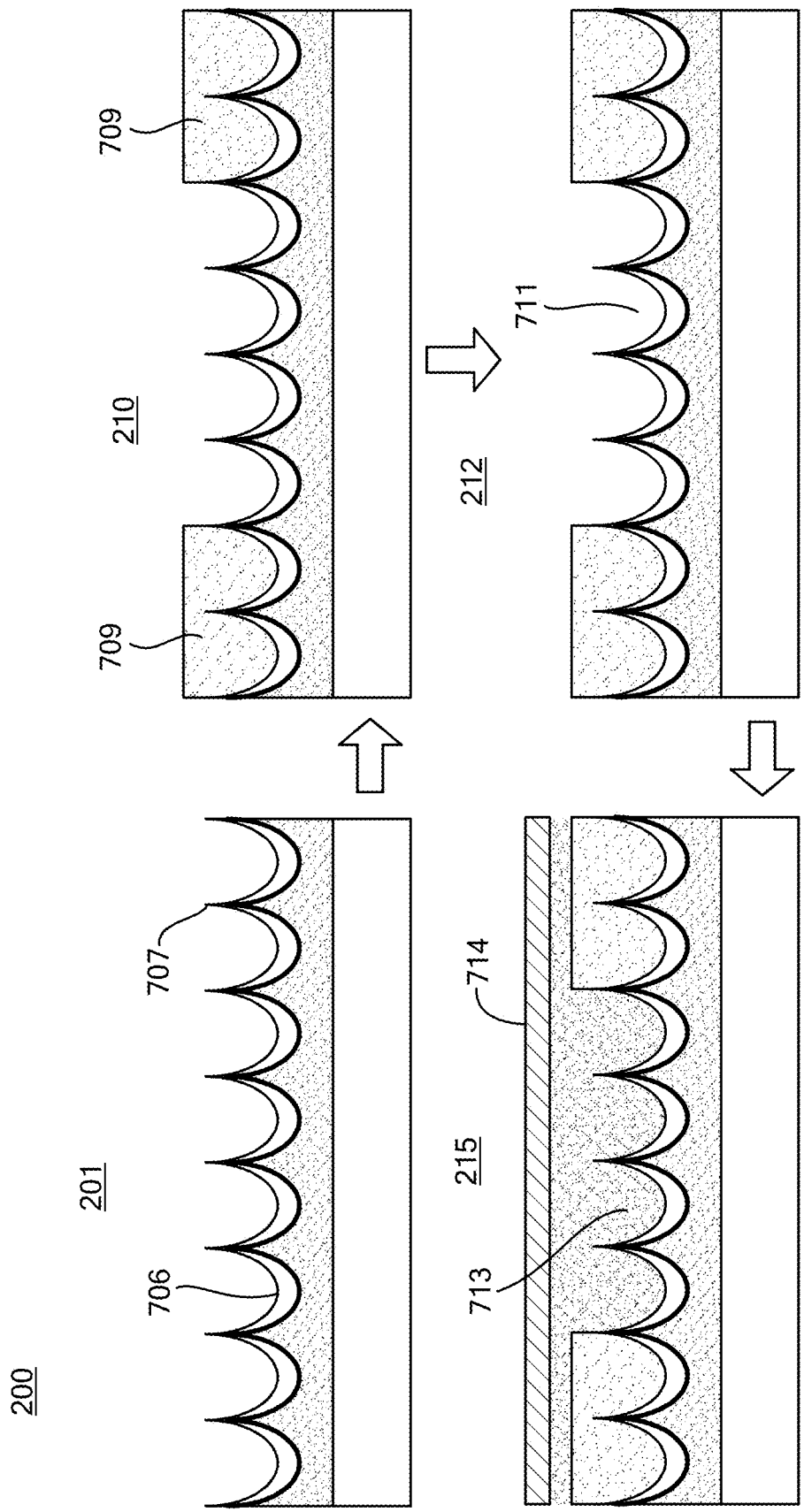
FIG. 2 shows general process steps for prior art process of forming a corrugated extraction layer with metal mesh TC on a substrate.

FIG. 2 shows an example of prior art for forming a corrugated substrate with patterned TC layer. As discussed above, structures such as these, although effective for light extraction, present challenges to OLED due to the non-flat nature of the surfaces for device deposition. It can be seen in this example that the corrugated surface upon which the OLED stack is deposited is can cause thinning of the stack layers on the tops of the protrusions and thickening of the stack layers at the bottoms of the protrusions, potentially resulting in device shorting and uniformity issues, among others.

Figure 3:
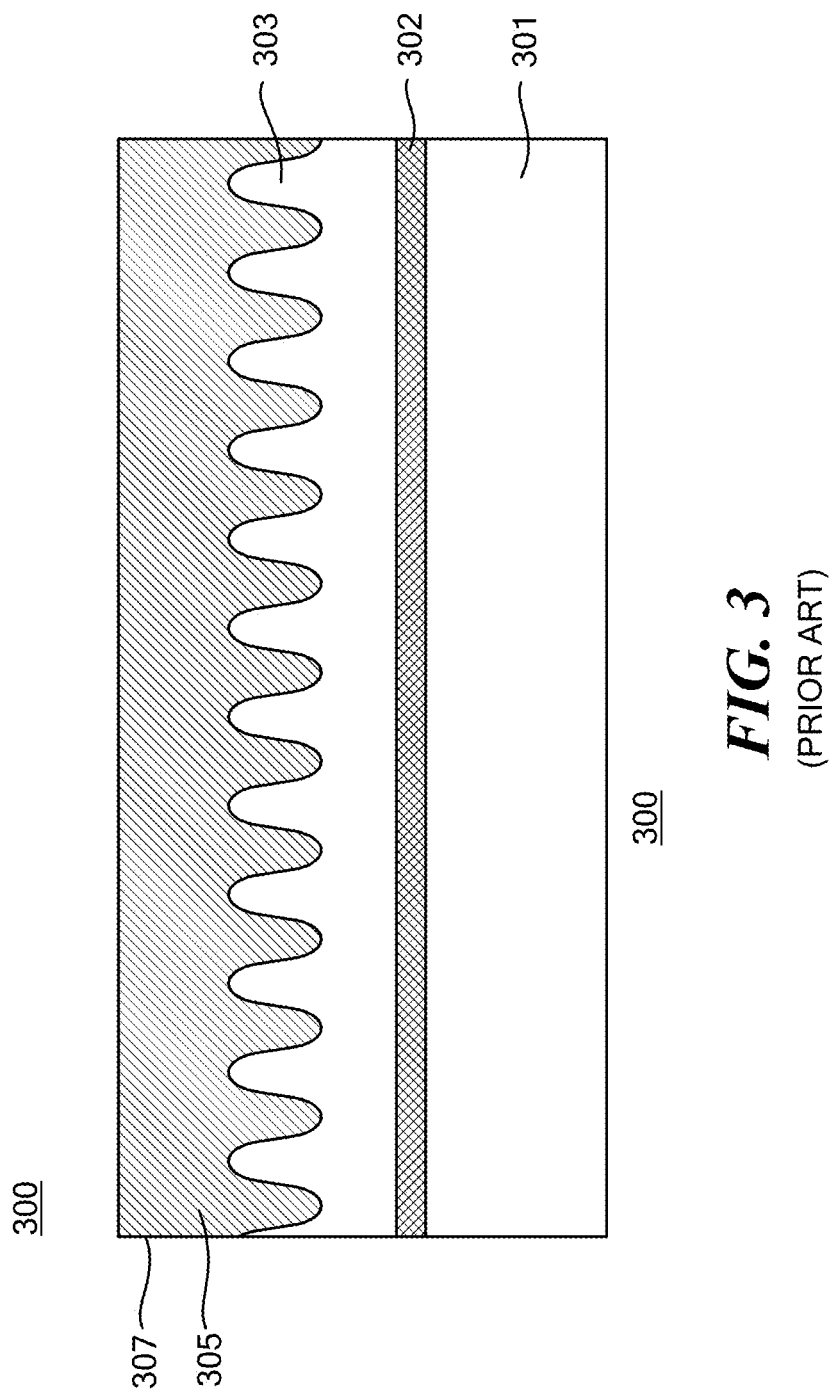
FIG. 3 is a cross-section view of a prior art planarized light extraction structure ("PLES")

FIG. 3 shows a structural embodiment 300 of the present disclosure for producing useful light extraction structures to address or eliminate the above-described problems with corrugated substrates. For convenience, such a light extraction structure can be referred to herein as a lanarized light extraction structure, or "PLES." For method 300, a low refractive index substrate 301 (e.g., with refractive index less than approximately 1.5), with optional barrier layer 302 and low RI patterned surface 303, is covered with transparent high RI layer 305, forming planar surface 307. Although buried corrugation structures have been used to improve the performance of OLEDs deposited upon this type of surface, such prior approaches have had the major disadvantage of requiring time-consuming and expensive semiconductor patterning. Embodiments of the present disclosure are directed to techniques allows buried corrugation structures to be formed rapidly and at significantly lower costs that prior techniques. One example of such a method of the present disclosure is shown in FIG. 4.

Figure 4:
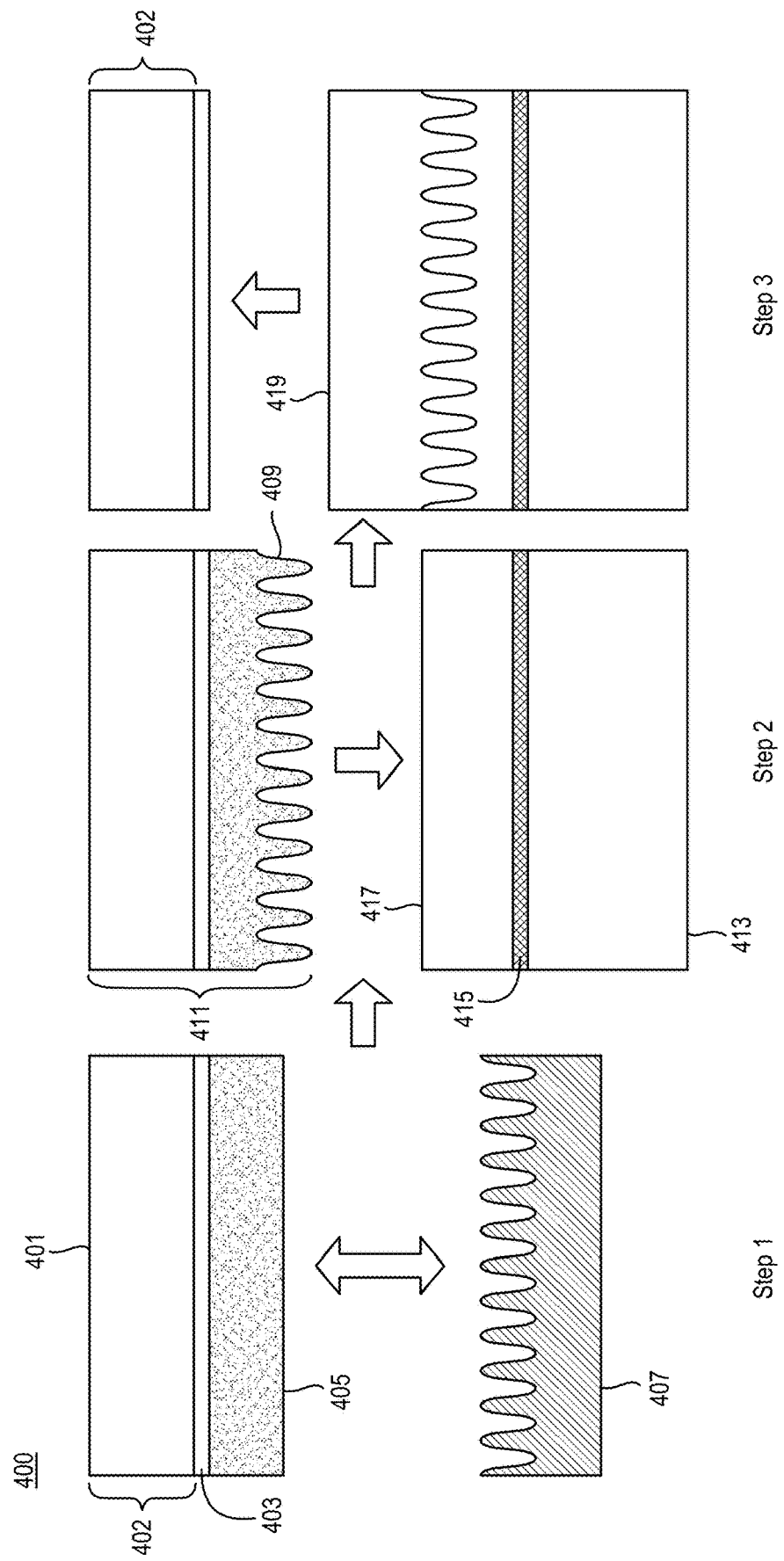
FIG. 4 shows an exemplary embodiment of a process for forming a PLES that includes a metal mesh transparent conductor, in accordance with the present disclosure.

FIG. 4 illustrates an example of an improved method/process for forming a planarized structure 400 with a buried extraction feature that utilizes a combination of high and low RI polymers, where in accordance with the present disclosure. As shown in Step 1, polymer donor film 402 having support 401 film and release layer 403 is coated with high RI liquid layer 405, for example a UV activated organic binder material filled with high refractive index nanoparticles (made of, e.g., Pixelligent SFT1, Norland 170, etc.). Nanoimprint tool 407 is used to pattern high RI layer 405 by UV curing through the tool or the substrate, where also thermal or chemical molding may be used. In Step 2, separation of tool 407 forms film 411 is formed with extraction pattern 409.

Also in Step 2, patterned substrate 411 is laminated to rigid or flexible glass substrate 413 (alternatively a plastic film with barrier layer 415) using low RI transparent liquid bonding material 417 (UV, thermal or other), followed by curing of the laminate. In Step 3, the laminate formed in Step 2 is separated at release layer 403 of donor substrate 402, thereby forming surface 419 having a mirror copy of the inner surface of donor film 401, providing a corrugated extraction structure with a planar surface for OLED deposition.

In another embodiment (not shown) of the process 400 of FIG. 4, the corrugated extraction pattern can be formed instead by imprinting into a low RI layer on a working substrate (glass or barrier-coated plastic), then bonding a high RI material to the (already-patterned) low RI substrate using a smooth reference surface (with suitable intrinsic release characteristics or coated release layer), thereby producing the PLES with smooth high RI top surface and buried high/low RI light extraction interface on the working substrate equivalent to that formed in Step 3 of FIG. 4.

Planar extraction patterns made by the methods of the present disclosure have a number of advantages relative to current fabrication methods, including: (1) the index difference is not limited by the use of glass substrates (n ~1.5); (2) extraction patterns can accommodate large variety of designs, including (but not limited to) columns, domes, wells, holes or sinusoids, etc.; (3) conventional lithography steps (e.g., photoresist coating>optical exposure>wet etching>cleaning) can all be replaced by rapid imprint and lamination steps; (4) a wide range of inexpensive films with various refractive indices can be used as the substrate, such as PET (polyethylene terephthalate), PEN (polyethylene naphthalate), polycarbonate, PMMA (polymethyl methacrylate) or the like; and/or, (5) PLES structures can be fabricated quickly and relatively inexpensively (relative to semiconductor fabrication methods) by R2R, R2R2P, and batch manufacturing.

Figure 5A:
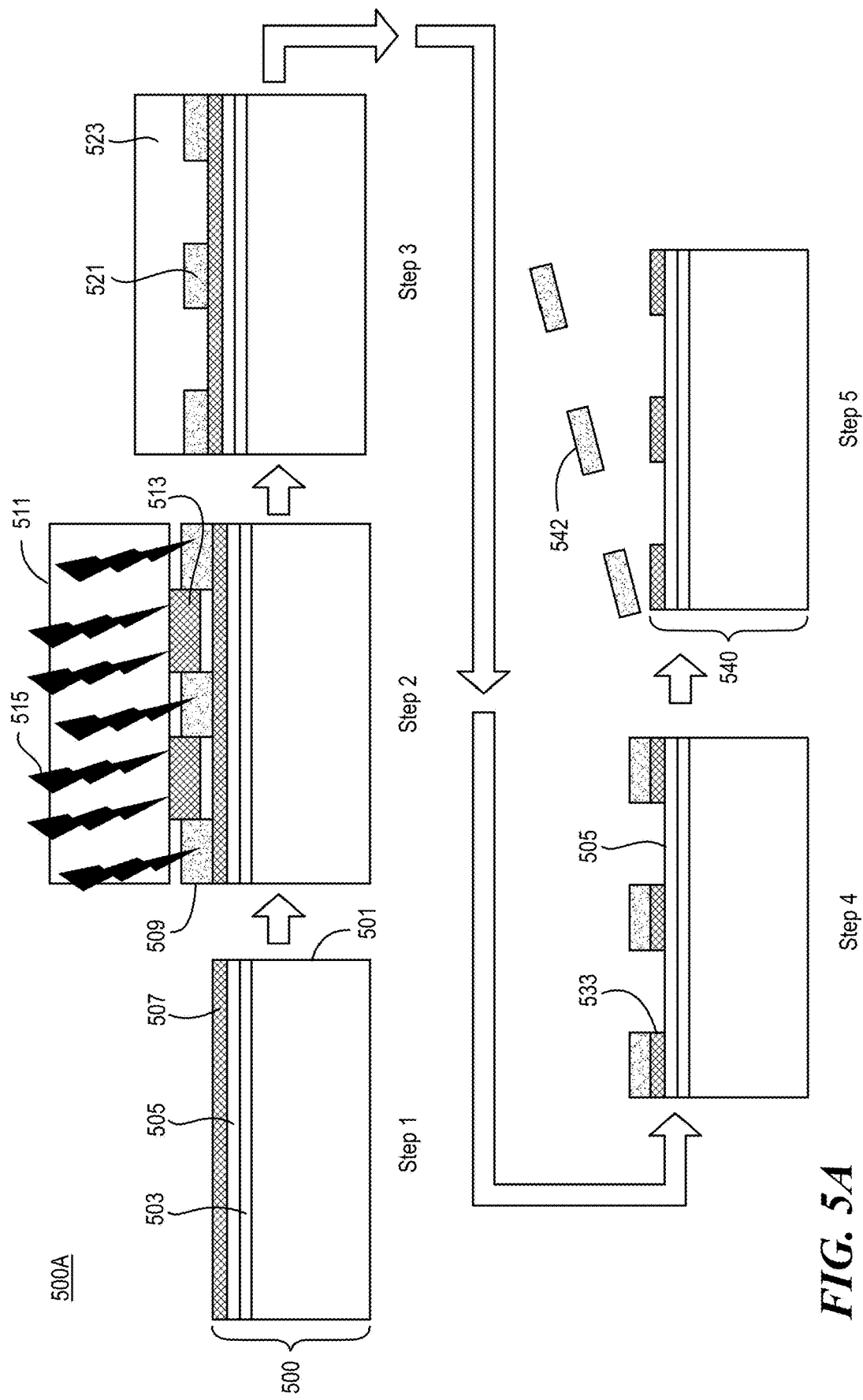
FIG. 5A-C are diagrams of an exemplary embodiment of a process for forming a PLES on a flexible substrate, in accordance with the present disclosure.
Figure 5B:
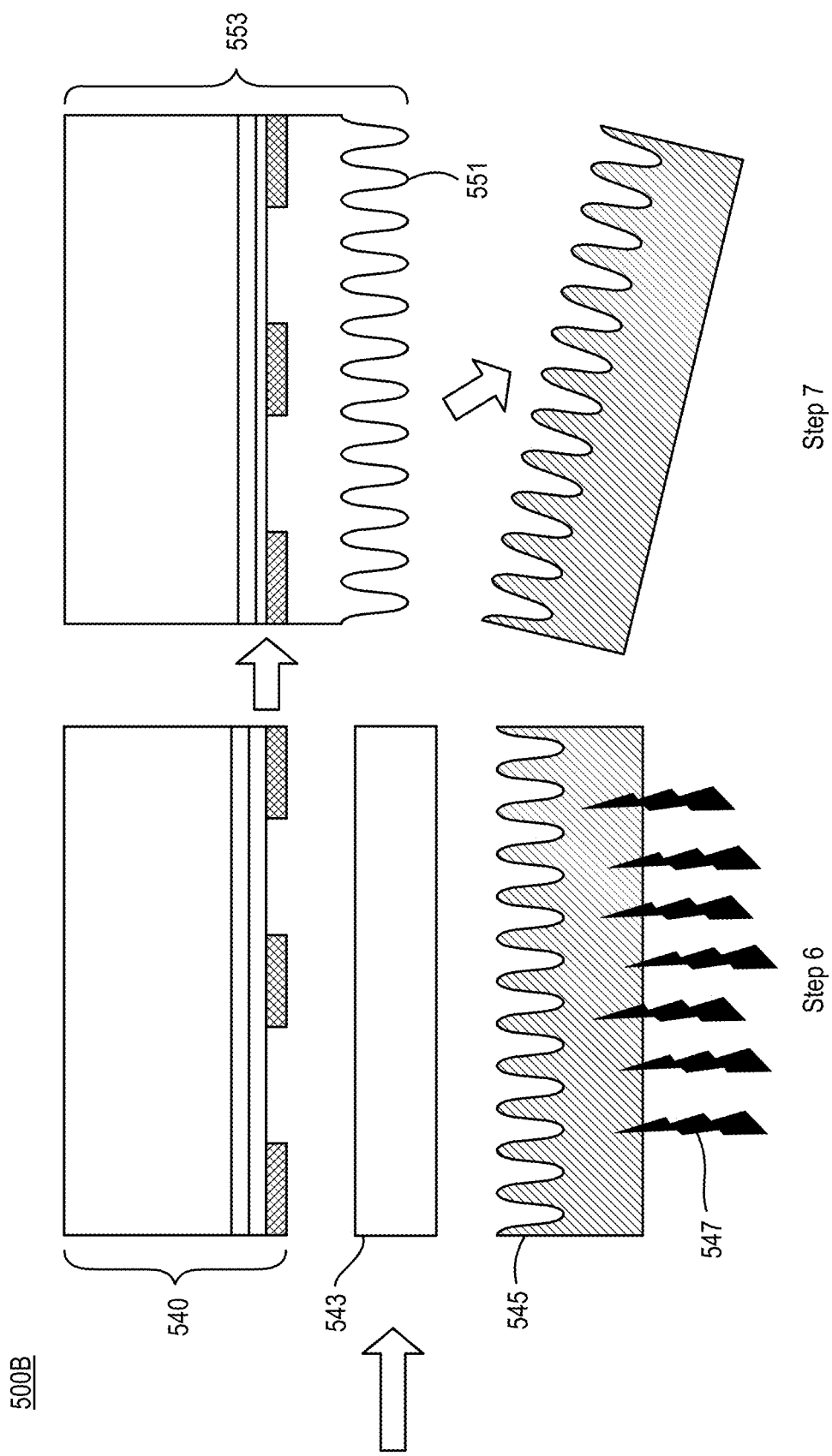

Another embodiment of the present disclosure includes a method for forming a PLES with embedded metal mesh transparent conductor, as shown in FIGS. 5A-5B. illustrating a step-by-step method of the present disclosure for both batch and roll manufacturing. This process is based on a donor-receiver process such as described above in which a flexible polymeric donor film is coated with several continuous thin-film layers in a specific order, typically by sputtering or other vacuum means, or by various other coating techniques, including solution coating, electro- and electroless plating, or others.

In Step 1 of FIG. 5A, feedstock film 500, including a flexible carrier film 501, such as PET or other polymer film, coated with a first thin release layer 503 (PTFE or other low surface energy material), followed next by a TC material 505, such as indium tin oxide (ITO), PEDOT:PSS (poly(3, 4-ethylenedioxythiophene) polystyrene sulfonate), Ag nanowires or other electrically conductive materials, and layer 507, a metal such as Cu or others that will subsequently form the conductive mesh pattern. In Step 2, a coated feedstock (a term herein used to denote a coated starting material to be used in subsequent process steps) 500 is laminated with liquid UV curable polymer 509 against a semi-transparent imprint tool including a transparent support 511 and opaque areas 513 that project beyond the clear areas of the substrate. These opaque areas correspond to the areas of the donor film in which metal is removed to form the desired mesh design, as described in Applicant's above-referenced co-owned U.S. patents.

After UV radiation exposure 515, areas 509 in Strep 2 are crosslinked (solidified) and the un-crosslinked liquid polymer is removed (not shown) by solvent rinsing in isopropyl alcohol or other to form in Step 3 resist mask 521 on the metal layer of the substrate. This substrate is then immersed in aqueous etchant 523 that is specific to the removal of metal 507 but not TC layer 505, after which neutralization, water rinse and drying (not shown) produces in Step 4 patterned metal 533 on TC layer 505. In Step 5 resist mask 542 is removed by chemical or mechanical means to form patterned metal donor film 540.

The process continues is in FIG. 5B, where in Step 6 a second imprint step is used to form the internal light extraction structure. Here, imprint tool 545 is laminated against substrate 540 using high RI liquid 543 (such as Pixelligent STF1, Norland 170 or others) and the laminate is exposed to radiation source 547 through tool 545 resulting in crosslinking of the high RI material 543. In Step 7, separation of tool 545 forms structure 553 with extraction pattern 551.

Figure 5C:
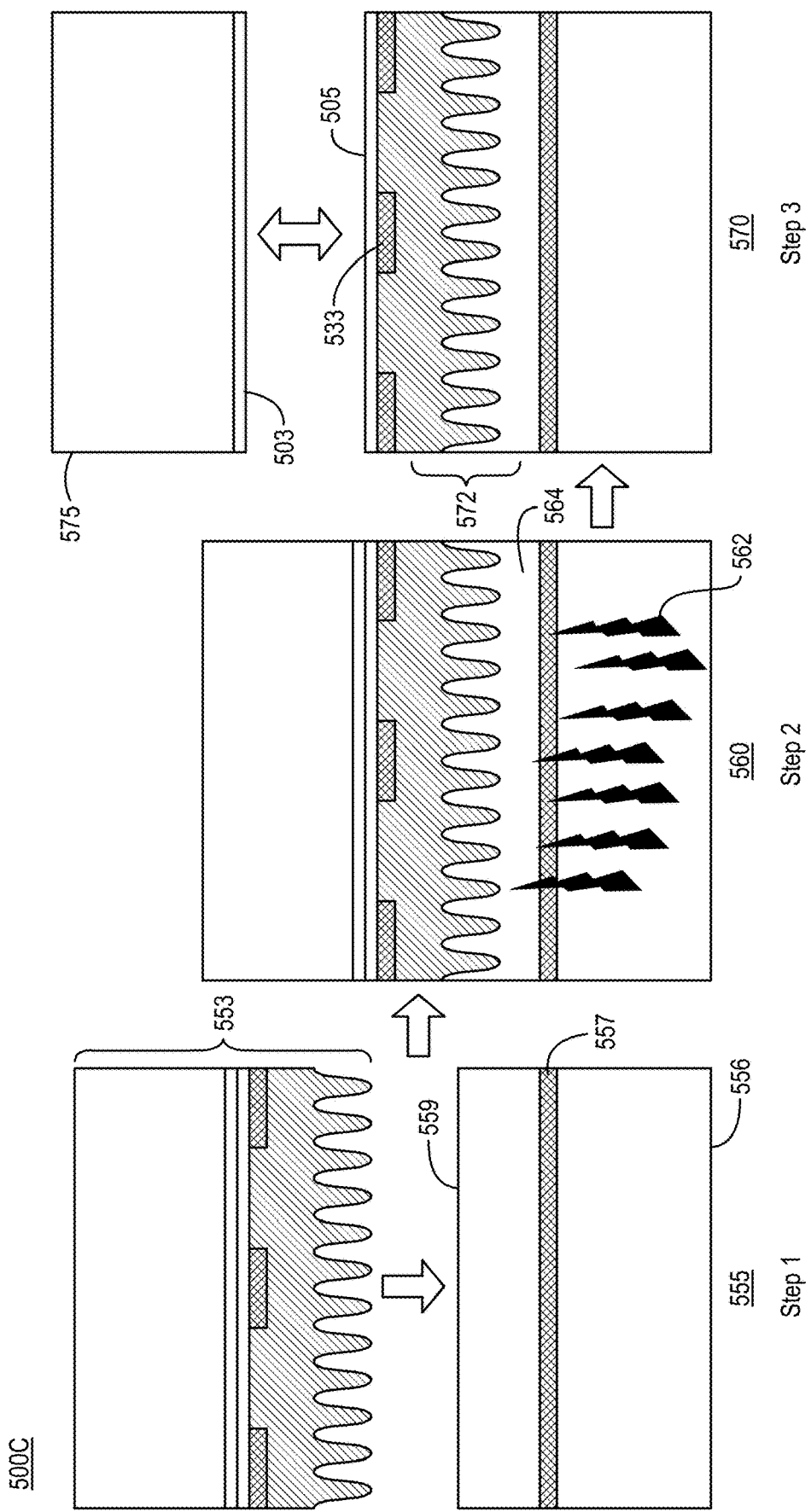

In Step 1 of FIG. 5C, structure 553 is laminated to receiver 555 including rigid or flexible glass support layer 556 (or plastic with barrier-coat 557) using low index transparent liquid adhesive 559, which in Step 2 is cross-linked by radiation source 562. source solidifies to structure 572. In Step 3, delamination of the donor film at release layer 503, receiver substrate 570 is formed, including a low RI/high RI extraction structure 572, buried metal mesh 533, and thin continuous conductor SOS, thereby providing smooth surface SOS for depositing OLEDs or other devices.

It is also possible to eliminate either or both of the conductive layers 505/533 when for example a continuous TC layer is to be instead applied as a step in the OLED deposition process, or in thinner form in combination with the embedded metal mesh. However, in the latter case, elimination of the metal mesh TC removes the significant advantage of providing uniform electrical conductivity and high current spreading required by larger-area devices Although the examples given above are illustrated as batch processes, they can also be carried out as roll-based processes, since there are significant advantages to this latter type of manufacturing, including large area production, high throughput and greatly reduced costs. A challenge to R2R fabrication of enhanced OLED substrates is that typical plastics utilized by these processes have intrinsically high levels of moisture and oxygen transmission, thus the substrate preferred for OLED lighting panels is rigid glass, due to high degree of moisture and oxygen transmittance as well as its low cost (another option, flexible glass, is difficult to process in roll form and very expensive). While production of enhanced OLED substrates in the form of glass panels would thus appear to require a corresponding batch-based patterning process, embodiments of the present disclosure provide modified roll processes that retains the benefits of R2R manufacturing for panel-based OLED production. For convenience, such processes will be referred to herein as a roll-to-roll-to-plate (R2R2P) manufacturing. For such R2R2P processing, major steps for producing the donor film are carried out by R2R processing, but in a final step the donor film is sheeted into panels for transfer to the receiving panel substrate. This latter step can be carried either "inline," using the donor supply roll to laminate to the receiving panels as needed, or "offline," where the donor roll is cut into panels and stockpiled for later use.

Figure 6:
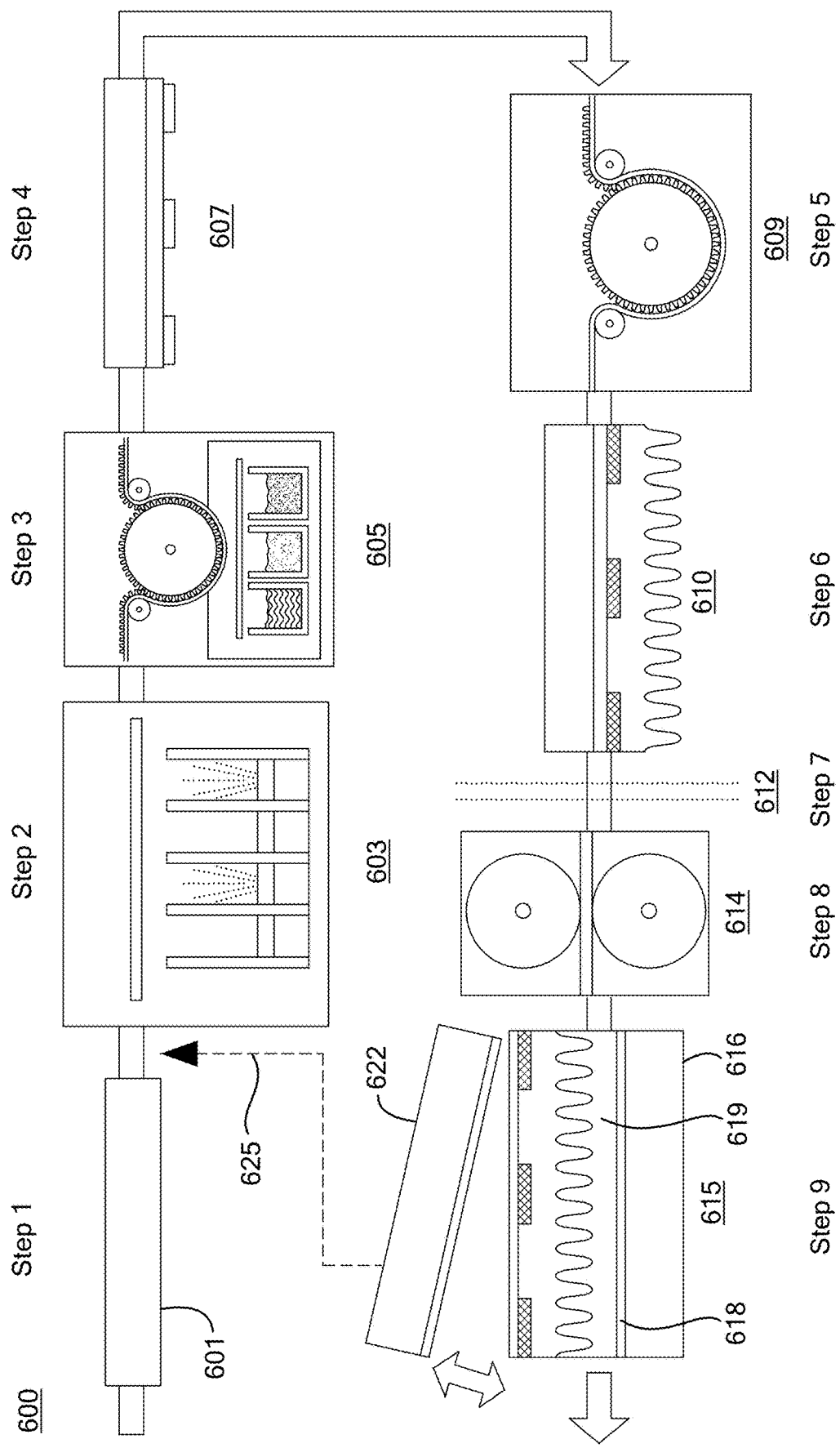
FIG. 6 illustrates a roll-to-roll (R2R) process for forming a planar light extraction structure on a rigid substrate, in accordance with the present disclosure.

FIG. 6 shows an exemplary embodiment 600 of the present disclosure that includes a roll-based variant of the process shown in FIGS. 5A-C. An unwind spool (not shown) can supply film 601 in Step 1, which in Step 2 is coated in vacuum chamber 603 to create a feedstock equivalent to 500 in FIG. 5A. In Step 3, film 601 is next processed in station 605, which for illustration brevity combines semitransparent drum imprinting and the wet etching step (this is given in more detail in 820/825 of FIG. 8). In station 605, the feedstock is continuously laminated against semitransparent drum where it is selectively solidified and next travels into a solvent bath where the liquid (un-crosslinked) residual resist is removed by isopropyl alcohol (iPA) or other appropriate solvent(s). After exiting the solvent bath, the masked film travels into a metal etch bath, then a neutralization bath and a final rise bath. At this point, patterned metal mesh film 607 can be rewound for later use, or in the single-pass process shown here, it continues into station 609 where in Step 5 a high RI UV material is imprinted over structure 607 using a drum having a desired extraction pattern, thereby forming in Step 6 donor substrate 610 with a planar metal mesh pattern embedded into the upper(un-patterned) surface of the high RI layer.

For rigid glass receiving substrates, the R2R2P process is used in which film 610 is cut into sheets at sheeting station 612 of Step 7, after which it is bonded to a receiving substrate in laminator 614 (Step 8) by curing a low index adhesive (e.g., one with a refractive index less than approximately 1.5) or any other known bonding technique. In Step 9, the laminate formed in station 614 is delaminated by removal of donor film 622, thereby forming finished receiving panel 615 including receiving panel 616 (with optional barrier layer 618) bonded with low RI layer 619 to the high RI structure with embedded metal mesh of 610, ready for OLED deposition. A R2R process may be used when the receiving substrate is a flexible glass or a plastic film with a barrier layer, in which case sheeting station 612 is not used and the rolls of donor and receiver are continuously laminated together at station 614, again using a low index adhesive and UV curing or other known bonding method. An adhesion promoter or surface adhesion treatment (not shown) may be used to improve adhesion to the receiving substrate if needed. Donor film 622 and structure 615 may be rewound together or delaminated and rewound to separate take-up spools (not shown). For further cost reduction and minimizing environmental impact, donor film 622 may be re-coated and reused via pathway 625 into vacuum coater 603.

Figure 7:
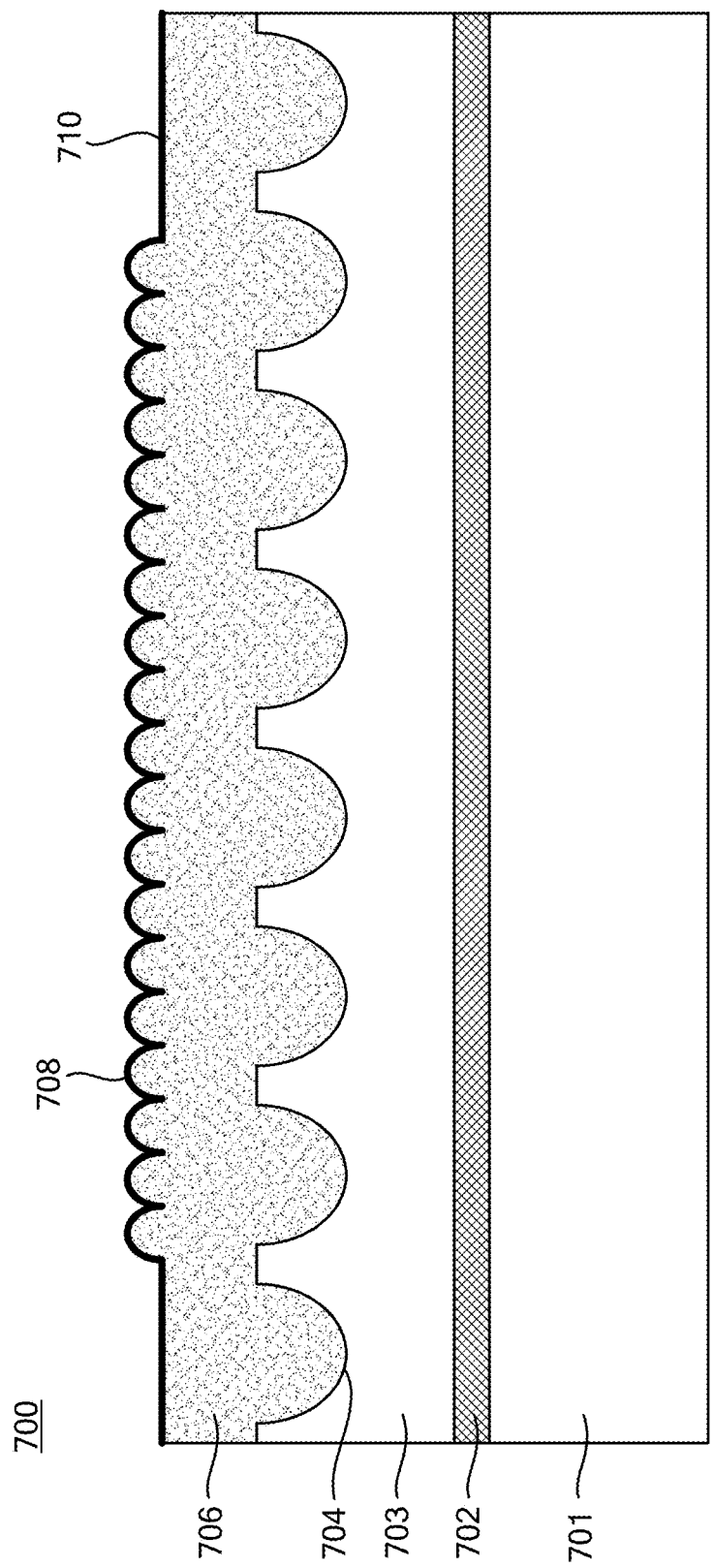
FIG. 7 is a cross-section of a dual pattern extraction surface, in accordance with the present disclosure.

The ability to control light for precise direction and extraction can be further enhanced by providing multiple extraction layers, and an embodiment of the present disclosure is the combination of a buried extraction layer and a surface extraction layer, as illustrated in FIG. 7. Here, structure 700 includes low refractive index substrate 701, such as glass or a plastic film with barrier layer 702, an undulating light directing structure 704 molded into either low RI transparent layer 703 or high RI transparent layer 706, and second undulating light directing structure 708, with optional conformal TC layer 710. In exemplary embodiments, the undulating light directing structure can have a relative high aspect ratio, e.g., an aspect ratio of height-to-pitch of the undulating surface that ranges from about 1-to-20 to about 20-to-1 and/or any subrange in between those ranges, inclusive of the end values; other ranges and values may of course be used within the scope of the present disclosure. The geometries of the lower and upper extraction layers can be independent, determined for example by mathematical modeling of the requirements of the specific device to be deposited. In one example, one patterned layer can have a large pitch and the other a small pitch, or one layer can have a random structure and the other periodic. In exemplary embodiments, a pitch can be in the range of 200 nm to 200 microns and a height in the range of 100 nm to 200 microns, and/or any subrange in between those ranges inclusive of the end values; other ranges and values may of course be used within the scope of the present disclosure; moreover, a pattern or array can have different pitches in different (e.g., orthogonal) directions. For another example, the top corrugation can be undulating and shallow while the lower corrugation can be deep and periodic.

Figure 8:
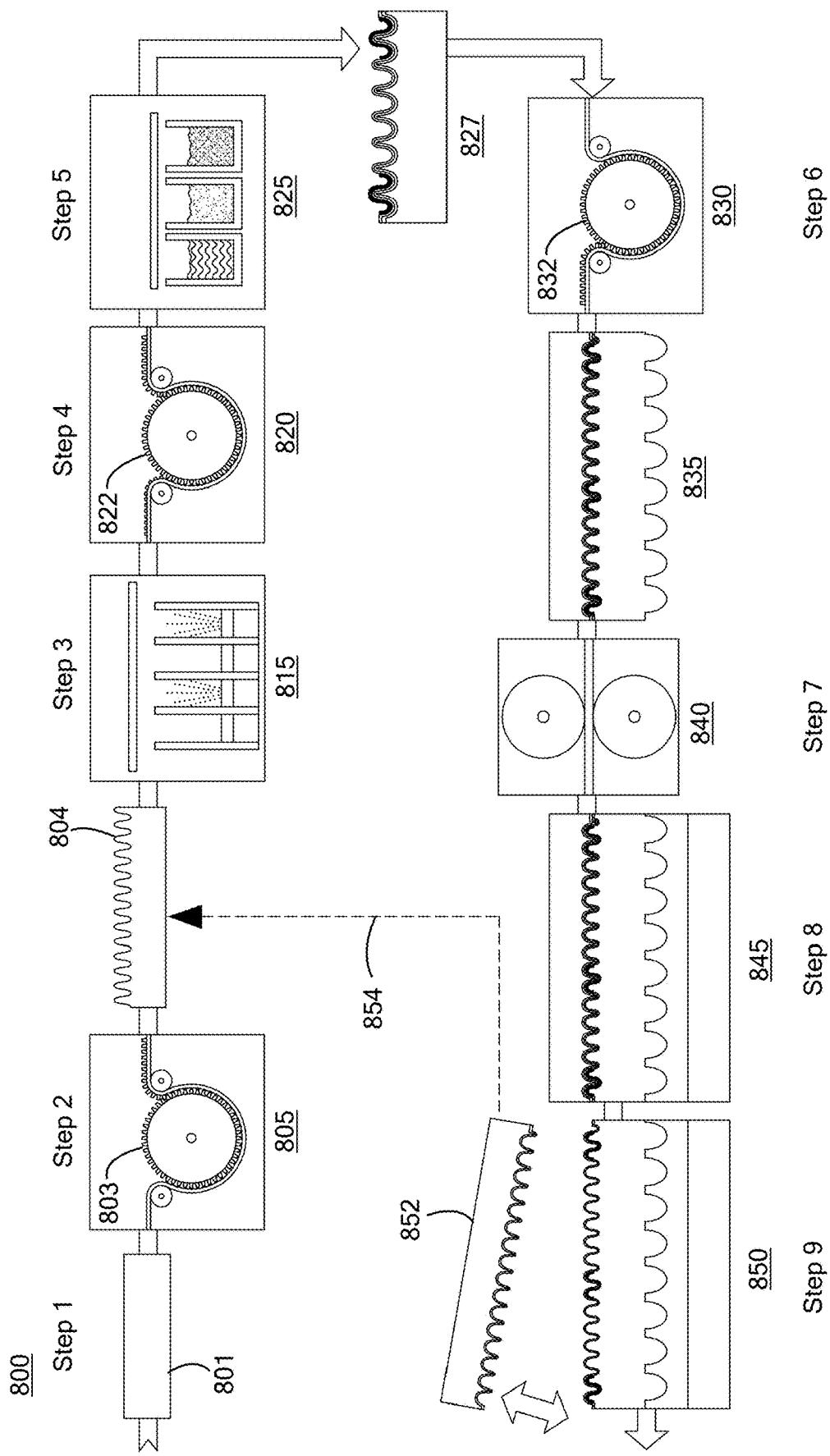
FIG. 8 illustrates a roll-to-roll-to-plate (R2R2P) process for forming a dual pattern extraction substrate with buried metal mesh TC, in accordance with the present disclosure.

One method for producing the dual patterned structure shown in FIG. 7 is illustrated in FIG. 8. In Step 1 of this embodiment, film 801 is transported from an unwind stand (not shown) into station 805 in Step 2, where it is patterned with structure 804 made using drum 803 with the mirror image of the desired upper extraction pattern. This surface is then vacuum coated in station 815 with a thin-film material stack similar to those described earlier (FIG. 5A, structure 500). Although the vacuum step may be done in-line, it is significantly less costly to carry out the deposition process by a separate R2R pass. The coated feedstock from 815 is transported in Step 4 into station 820, where semi-transparent imprint drum 822 forms a resist mask for the metal mesh pattern. The film with crosslinked mask with residual uncrosslinked polymer is transported into station 825 where the residual resist is removed by appropriate solvent (iPA or other), the metal wet etched to remove unwanted metal, the etchant neutralized and the film rinsed and dried, producing substrate 827. In Step 6 the film next moves into imprinting station 830, where second light directing pattern 832 is UV imprinted into a high RI liquid resist, forming donor substrate 835 having dual extraction structures and a buried metal mesh TC. In Step 7, the donor film then travels into station 840, where it is laminated to receiving sheet 842, a flexible glass or barrier-coated (not shown) plastic film, using low a RI transparent UV bonding adhesive (process not shown for clarity) or by other known bonding methods, producing laminate 845 upon exiting laminator 840, shown in Step 8. In Step 9, patterned donor sheet 852 is delaminated at the feedstock release layer, producing structure 850, an enhanced OLED deposition substrate having dual internal extraction layers, buried metal mesh TC and, optionally, a continuous top layer TC. For further cost reduction and minimizing environmental impact, donor film 852 can be recoated for reuse via pathway 854.

An aspect of the present disclosure is directed to use of external extraction structures, for example a microlens array (MLA), to improve light extraction from the substrate into air (emission side) by reducing the TIR at the interface between the substrate and such an external extraction structure. An MLA—which, for the purposes of this description can also be a moth-eye structure or other type of light extraction pattern—can be incorporated into any of the substrates described herein by direct substrate imprinting or by bonding a pre-formed MLA film to the air side of the receiving substrate using the techniques of the present disclosure. Two examples of MLAs according to the present disclosure are shown in FIG. 9.

Figure 9:
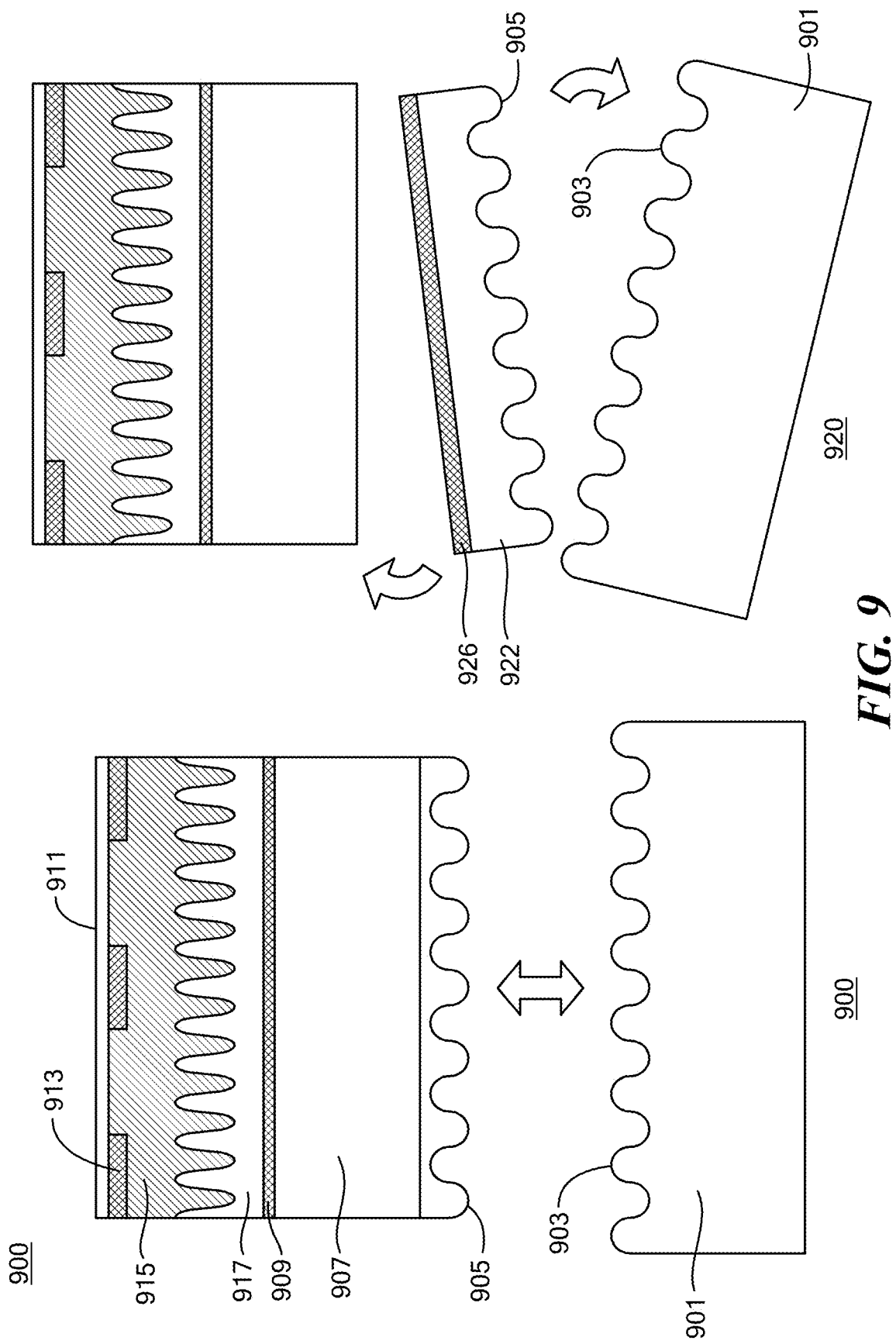
FIG. 9 is a diagram showing a cross-sectional view of two methods for forming an external (substrate) light extraction layer on a receiver substrate, in accordance with the present disclosure.

FIG. 9 is a diagram showing a cross-sectional view of two methods for forming an external (substrate) light extraction layer on a receiver substrate, in accordance with the present disclosure. As shown in FIG. 9 for 900, substrate 901 with external extraction pattern 903 can be used as an imprint mold to form MLA 905 in a material having an appropriate RI, on receiver substrate 907. Barrier layer 909 may be used when substrate 907 is a polymer film. Layer 917 can be a low RI transparent polymer having an undulating upper surface which is bonded to high RI transparent layer 915, over which is embedded planar metal mesh pattern 913 overcoated with continuous TC 911.

In another embodiment, shown by 920, a MLA is added to the receiver substrate in the form of film 922 having MLA pattern 905 previously made from tool 901 having pattern 903. Film 922 is bonded to the receiving substrate using adhesive 926, such as a UV adhesive, pressure sensitive adhesive (PSA) or other adhesive means. The steps described in these embodiments can be carried out either before or after device deposition and encapsulation.

Incorporating polymeric extraction structures into OLED devices represents an ongoing challenge for OLED panel manufacturers due to problems in providing a highly effective seal against the ingress of moisture and oxygen over time. Because polymers are typically characterized by a relatively high permeation rate for moisture and oxygen, and because OLEDs suffer from severe degradation from such contaminants, any polymer layers incorporated into the device structure have the potential to produce moisture/oxygen pathways leading to OLED failure. In addition, when OLEDs formed on polymer surfaces are cut into individual devices, an open polymer edge is produced that allows leakage unless carefully sealed. Even top encapsulated devices can retain areas of vulnerability at these edges, particularly in areas the metal electrode contacts extend beyond the encapsulated device into the environment, as shown for structure 1000 of FIG. 10.

Figure 10:
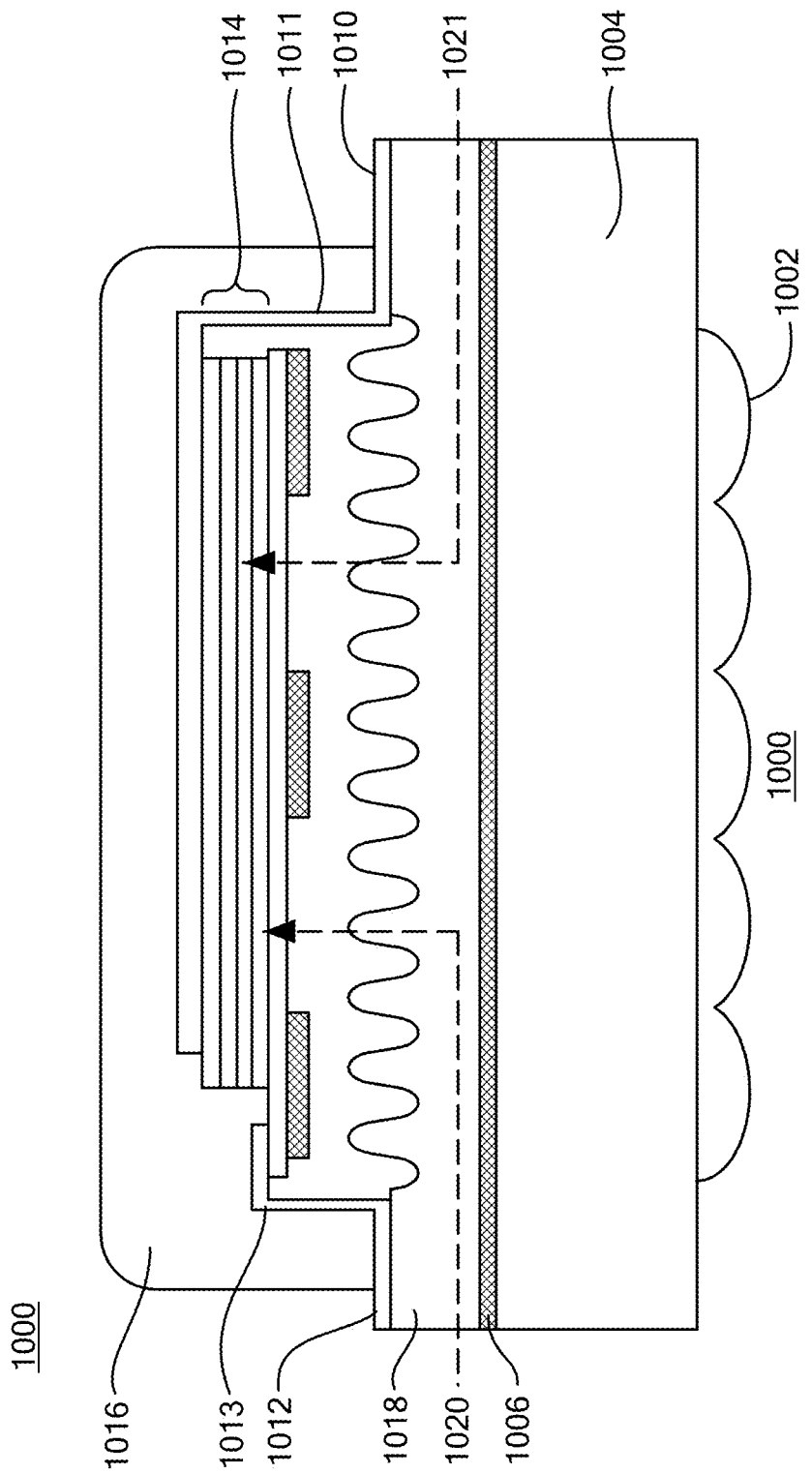
FIG. 10 is a diagram showing a cross-sectional view of an encapsulated OLED showing unwanted moisture/oxygen leakage pathways, in accordance with the present disclosure.

FIG. 10 is a diagram showing a cross-sectional view of an encapsulated OLED 1000 showing unwanted moisture/oxygen leakage pathways, in accordance with the present disclosure. In FIG. 10, a corrugated polymer layer 1018 is shown formed on barrier layer 1006 of substrate 1004. Electrical contact leads 1010/1011 and 1012/1013 extend from top encapsulated seal 1016. The device shown can be vulnerable at pathways 1020 and 1021 between the encapsulated area and the substrate (being glass or barrier-coated film), which lead into OLED stack 1014. An aspect of the present disclosure provides for the elimination of such polymer leakage pathways in polymeric extraction structures in OLED and other oxygen/moisture sensitive devices. OLED (or OLED device/structure) 1000 can include, as required, any or all of hole injection layer, hole transport layer, emissive layer, blocking layer, electron transport layer, anode layer, cathode layer, and/or others as needed.

Figure 11A:
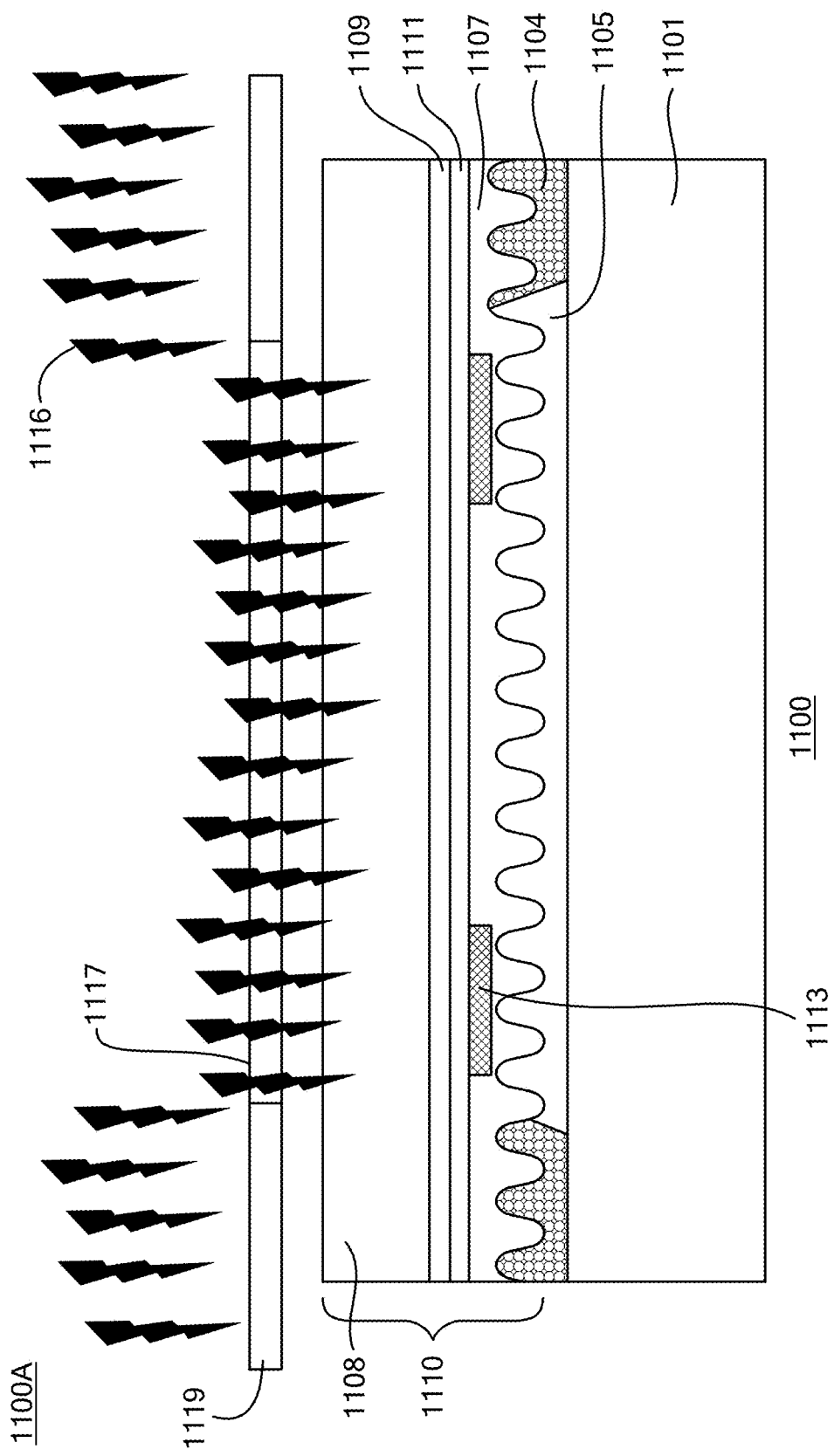
FIGS. 11A-B show a method for forming an extraction pattern that eliminates moisture/oxygen leakage pathways, in accordance with the present disclosure.

FIG. 11A shows an example of a structure 1100A according to the preset disclosure, without the above-noted polymer leakage pathways. Structure 1100A can be formed by a process shown as beginning at the point of lamination of the donor and receiver substrates, as shown previously. Donor substrate 1108 includes release layer 1109, continuous TC 1111, buried metal mesh 1113 and high RI patterned layer 1107 to form donor stack 1110. The donor stack is laminated to receiver substrate 1101 using low RI adhesive 1104. Photomask or stencil mask 1119 is interposed between crosslinking radiation source 1116 and the substrate side of substrate 1108. Exposure through the open areas 1117 of mask 1119 thus results in crosslinking of polymer 1104 only in area 1105.

Figure 11B:
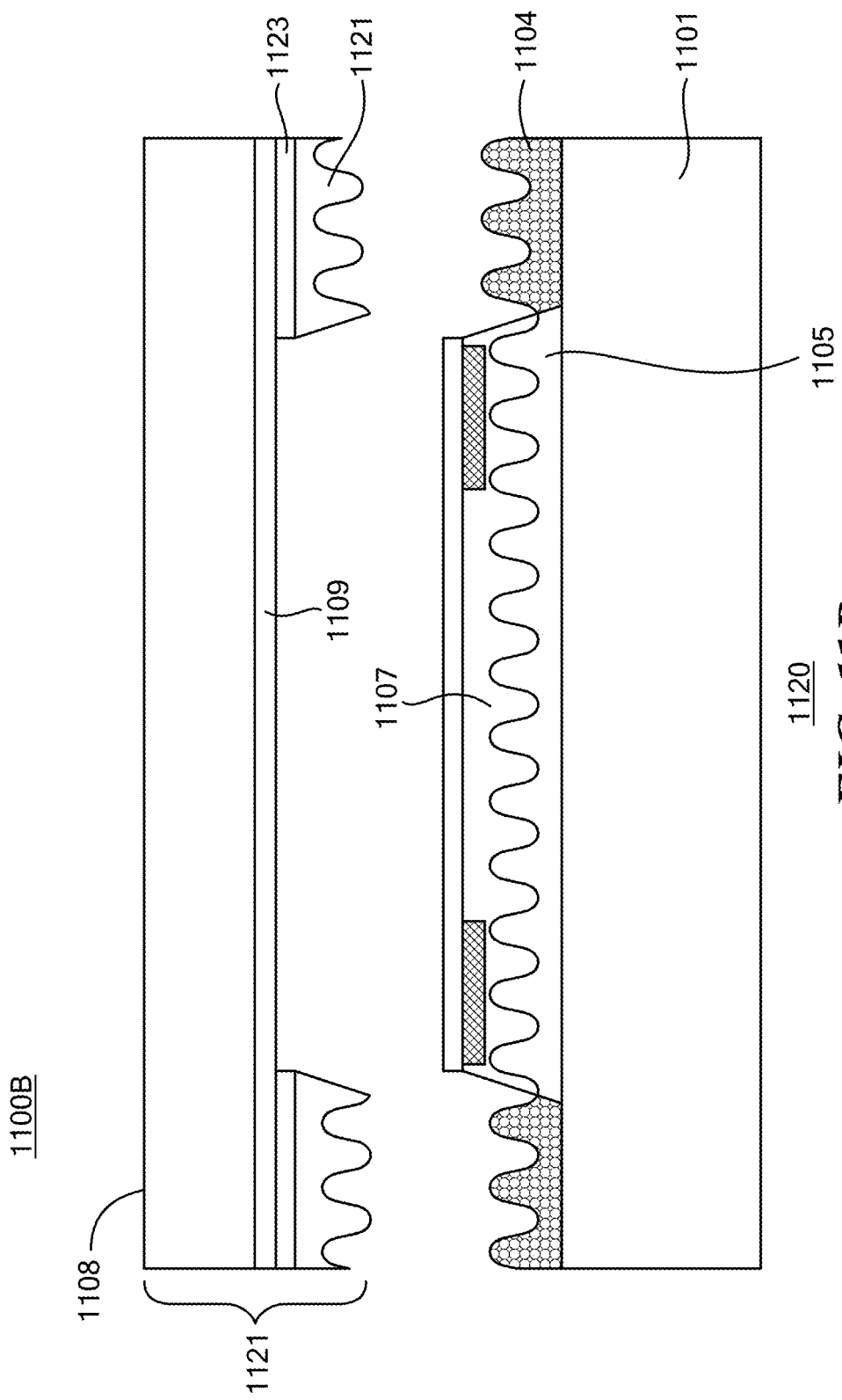

In FIG. 11B, donor substrate 1108, including release layer 1123 and high RI pattern 1121 is separated after exposure (FIG. 11A) from receiver substrate 1121, where area 1104, having received no radiation through the opaque areas of the mask, remains liquid and therefore does not adhere to high RI pattern area 1121. The crosslinked area 1105, on the other hand, bonds to the high RI layer 1107, which in turn is also bonded to the metal mesh and TC layers, and separates at release layer 1109, since adhesion of this structure to the low RI adhesive is stronger than to the release layer. Unexposed resist 1104 is removed by mild solvent (iPA or other) treatment. Because exposure mask 1119 of FIG. 11A is designed to prevent crosslinking of any of the resist surrounding the OLED deposition target area, only bare glass (or barrier coating) surrounds this area, thereby eliminating this source of leakage pathways in the final device.

Another challenge to panel manufacturers is making good electrical contact to the active device. This is problematic where, for example, the device stack is formed on a cut polymer extraction film bonded to a barrier substrate, as the cutting process can produce relatively vertical edges for the polymer film. Undercuts may also occur in the bonding adhesive areas where the plastic is attached to the glass/barrier substrate. Thinning of the deposited metal anode and cathode connectors at vertical surfaces (c.f., FIGS. 10, 1013 and 1011) and metal discontinuities at the adhesive-glass interface are problematic in panel manufacturing.

These shortcomings are overcome by embodiments of the present disclosure, e.g., as shown in FIGS. 11A-B, by improving the electrical conductivity of anode and cathode connections (within the device deposition footprint to avoid leakage) during transfer of the donor structure to the receiver substrate. It is an aspect of the current invention to accomplish improved electrical contact by creating a slope or tapered ramp on the receiver substrate extending from the outer perimeter of the cured low RI adhesive polymer to the top surface of the (raised) polymer extraction layer. This is accomplished by moving the photomask/stencil 1119 (FIG. 11A) away from substrate 1108 by an amount that allows blurring at the outer edges of the transferred adhesive at area 1105 due to light scattering during exposure. The gradual decrease in exposure level moving from the clearfield to the darkfield areas of the mask results in a thickness reduction in the adhesive polymer from the fully exposed to the unexposed areas of the adhesive. The slope details depend on the mask-to-substrate separation distance, the exposure time, and the responsivity of the UV resist, with the resulting structure helping to avoid contact thinning and discontinuous electrical contact.

Figure 11C:
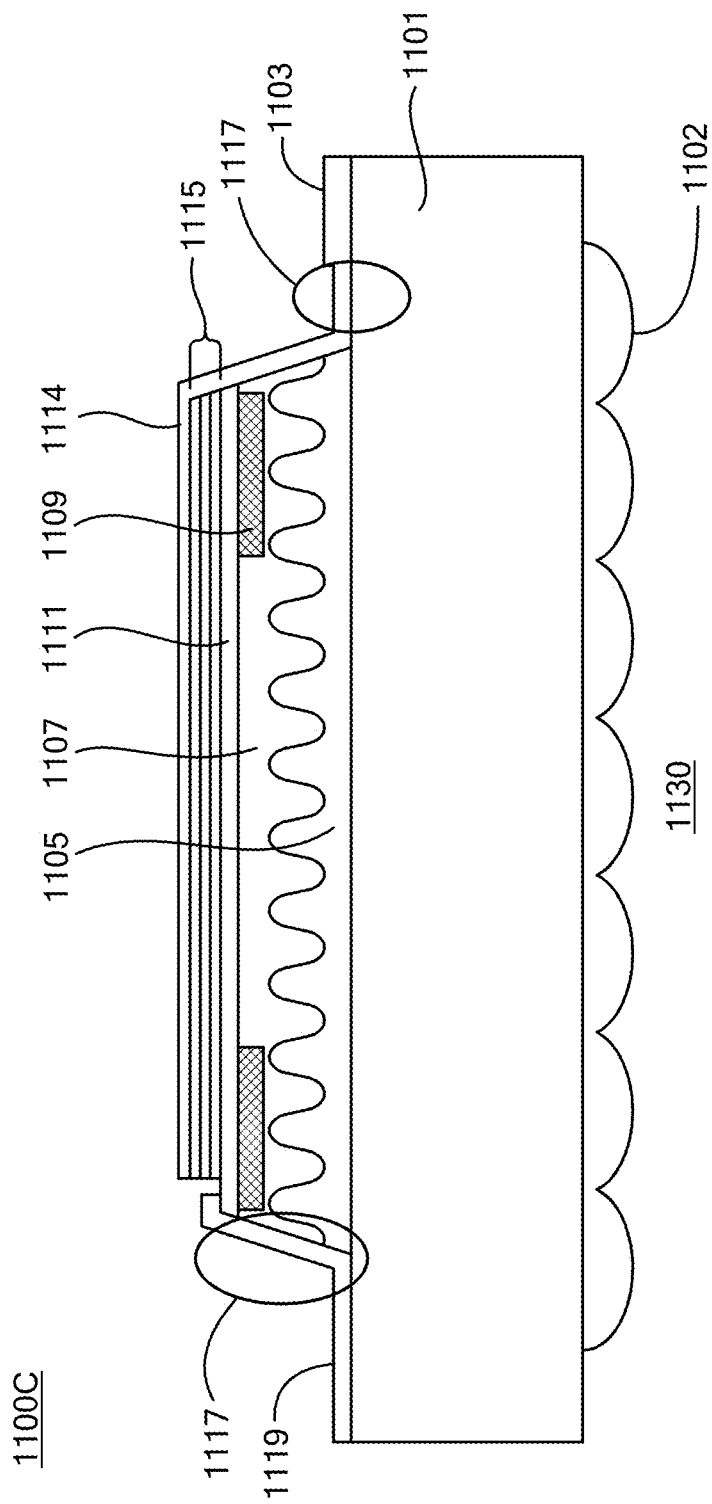
FIG. 11C is a cross-section of a full OLED device on a substrate with multiple enhancement, in accordance with the present disclosure.

FIG. 11C shows a finished OLED device 1100C in cross-section (encapsulation layer not shown for clarity) fabricated on an enhanced substrate that incorporates multiple embodiments of the present disclosure (note that the numbering reflects equivalent structures in FIGS. 11A-C). Structure 1130 includes glass substrate 1101 with bonded polymeric MLA 1102 and low/high RI buried extraction layer 1105/1107. The top of high RI layer 1107 is planar, with embedded metal mesh 1113 and continuous TC 1111. Multi-layer thin film stack 1115 represents the OLED diode, with top metal 1114 the cathode contact. Area 1117 represents the electrode contacts deposited on the ramp from the glass substrate to the planar top surface that provides uniform anode and cathode connections to the device. Area 1117 also shows the polymer-free area that surrounds the entire device.

It is another aspect of the present disclosure to form metal mesh transparent conductive structures having surfaces with reduced roughness for improved device deposition. And it is yet another aspect to provide a method for forming metal mesh transparent conductors with significantly reduces diffraction effects arising from periodicity in the conductive patterns.

Figure 12:
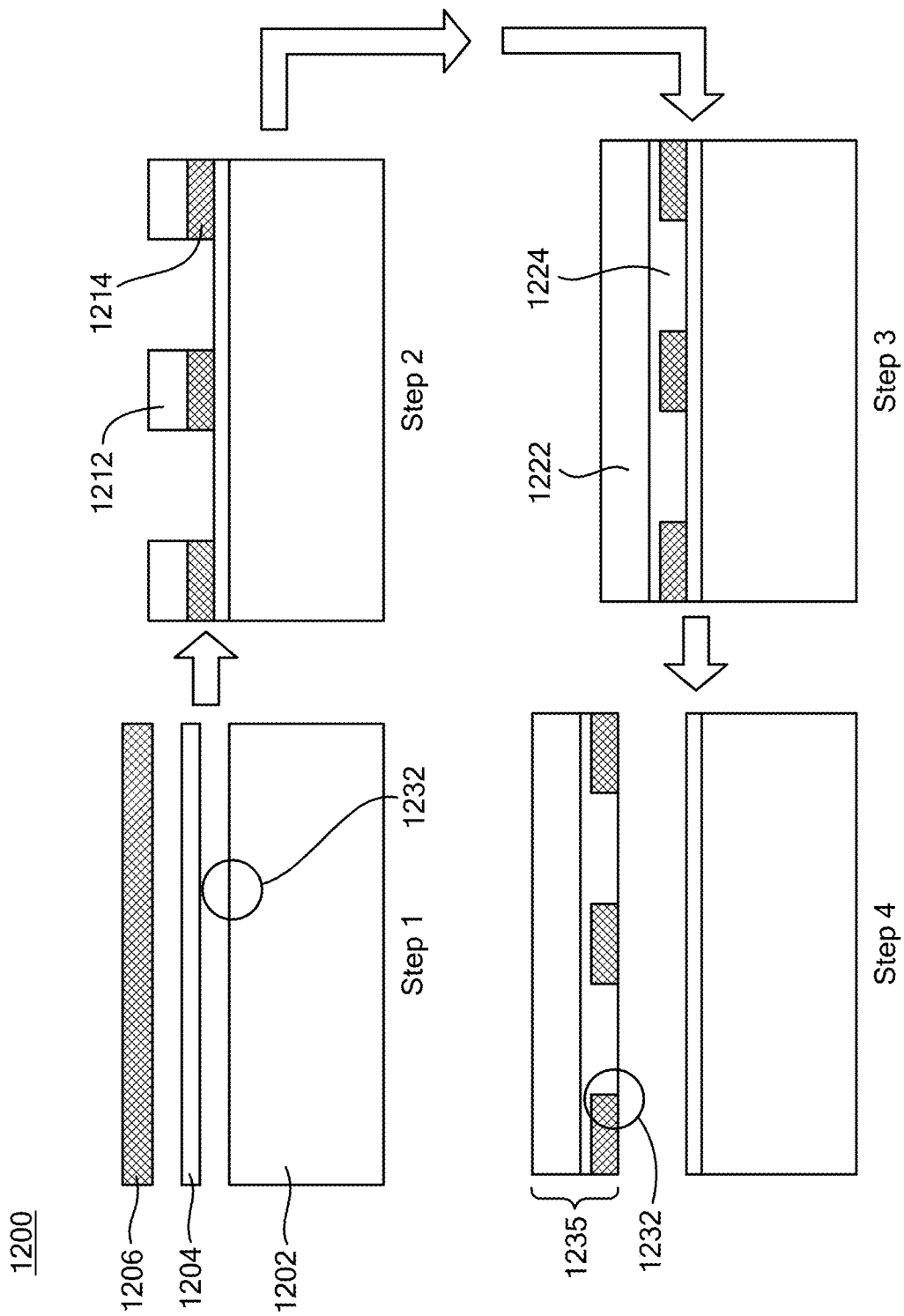
FIG. 12 shows a process for producing smooth embedded metal patterns with low surface roughness, in accordance with the present disclosure.

FIG. 12 illustrates an embodiment 1200 in which a patterned metal having a very low surface roughness is produced for transparent conductive meshes and electronic circuitry, such as thin film transistors (TFTs), photovoltaic (PV) devices, smart windows, and EMI shielding, among others.

The exemplary embodiments provided above (e.g., as shown in FIGS. 5A-B, etc.) may be modified for desired electronic and/or photonic applications, such those requiring a very low level of metal roughness, or one in which the conductors need to be coplanar with the top surface. In FIG. 12, item 1232 represents, for example, a high-quality optical-grade surface, such as a Si wafer, polished glass flat, etc. In Step 1, thin release layer 1204 (<10 nm PTFE, silicone, or other release material) is deposited on surface 1232, followed by metal layer 1206, where both may be formed by sputtering, for example. In Step 2, the processes described previously in this disclosure are used to form metal pattern 1214 from polymer resist mask 1212. In Step 3, receiver substrate 1222 is laminated to metal pattern 1214 (after removal of mask 1212) using adhesive 1224 (which may be, e.g., a UV-cured adhesive, epoxy, or other suitable adhesive selected to provide high adhesion to both metal 1214 and substrate 1222). In Step 4, separation of the laminate of Step 3 produces structure 1235 having a planar metal surface that effectively has mirror-image smoothness of surface 1232 on which it was originally deposited.

An additional use of metal structures with very low roughness surfaces is in "cold welding" of similar metal surfaces, as is well known (a typical example being two machined steel surface blocks in contact that cannot be separated, or undesired welding of metal components in spacecraft). This enables low temperature, adhesive-free bonding for (clean) metals with such low roughness surfaces for electronics applications where dielectric (insulating) layers cannot be tolerated or are otherwise undesirable.

Another embodiment of the present disclosure is the use of a "tuned" RI layer for embedding metals, by processes described above, in the donor-receiver transfer process, in that it allows embedding material to better match the RI of adjacent layers. For example, matching the transferred mesh to a receiving surface such as a TCO or a high index inorganic layer in order to minimize unwanted reflections resulting from the index mismatch. As another example, a lower refractive index adhesive would be used to match the metal mesh structure to a plastic substrate. For typical metal mesh structures, the metal occupies a small proportion of the total surface area of the conductive layer (often <5%), therefore the net RI of the layer is essentially that of the matrix in which the conductor is embedded.

Methods according to present disclosure can also allow for adjustment of the conductivity of a given metal mesh pattern by changing the thickness (surface perpendicular direction) of the metal with negligible effect on optical transmission of the mesh. For example, doubling the thickness of deposited metal layer (FIG. 5A, 507) in the donor feedstock film 500 (FIG. 5A) results in metal line with twice the thickness for the same line width, producing wires with greater cross-sectional area. Additionally, thickness increases of the conductive lines occur below the surface of the buried lines and do not alter the quality of the top metal surface.

A significant problem exists with some applications of periodic conductive patterns in that light transmitted through such patterns can be diffracted into various diffractive orders by simple parallel lines, but the number of orders increases dramatically going to square geometries (two diffraction axes) and to hexagonal geometries (three diffraction axes). The resulting multiplicity of orders can be very objectionable when viewing through surfaces having patterns. It is well known in optics that as the pitch of periodic structures increases, the diffractive orders approach the zeroth-order (i.e., un-diffracted) spot for a point source, and for large mesh pitches (hundreds of microns), the diffractive orders effectively appear to coalesce into the main order. However, when viewing strong point sources in transmission, such as the sun, streetlamps or indoor lamps, even large pitches (e.g., >500 μm) will show distinct higher order diffractive effects. This can be objectionable for devices such as OLED lighting panels and other devices using metal mesh transparent conductors, such as EMI shielding, smart windows, PV cells, among others.

Figure 13A:
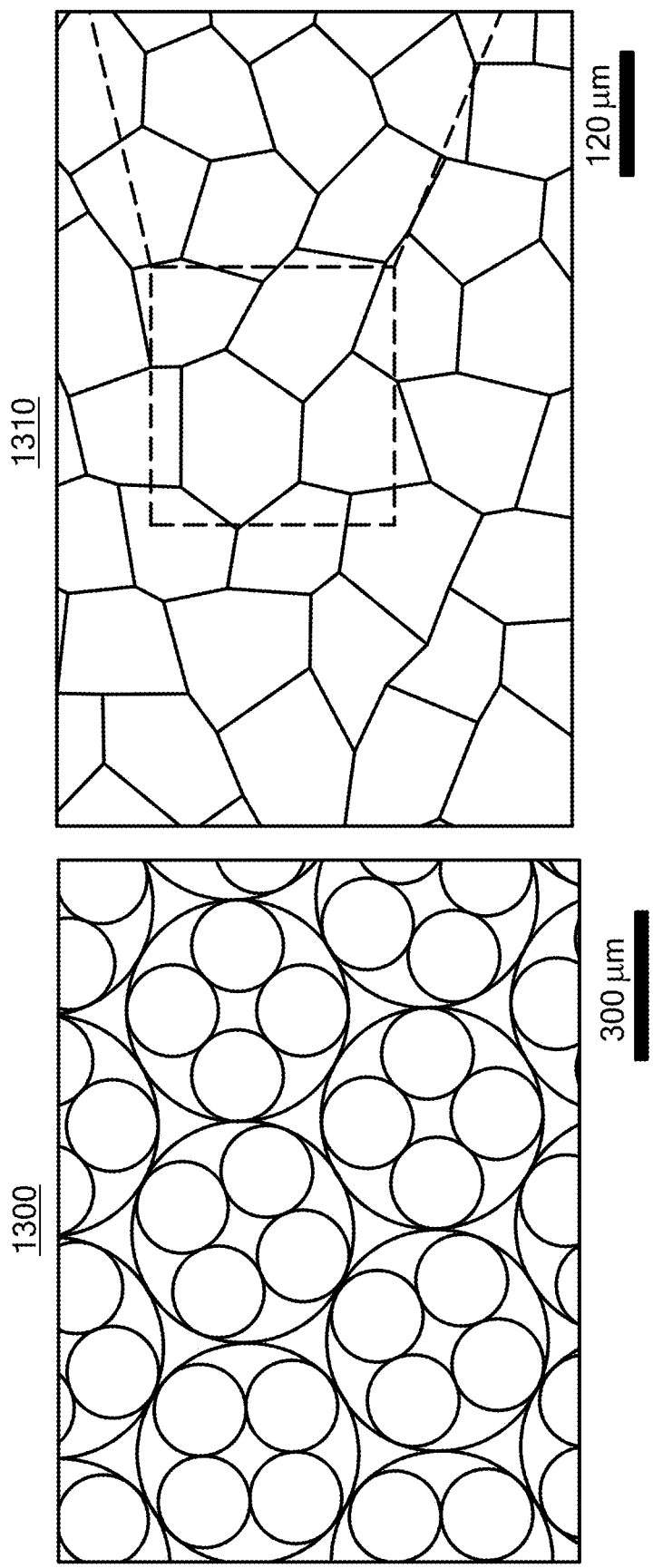
FIG. 13A illustrates two examples of prior art for low diffraction metal mesh structures.

Structures designed to significantly reduce or eliminate diffraction have been reported in the literature, and one embodiment of the present disclosure is an improved method for forming metal mesh TC films that exhibit low diffraction. FIG. 13A, 1300 and 1310 illustrate examples of prior art in the development of patterns having low periodicity and therefore reduced diffraction effects. In addition to unwanted diffraction, reflectivity and glint can also be problematic for these applications. This is particularly true where the surface area occupied by metal pattern is larger (e.g., where wider lines are required). Solutions such as surface roughening can result in diffuse scattering and reduced conductivity. Accordingly, another aspect of the present disclosure is directed to and provides methods to reduce diffraction and reflections in metal mesh films.

Figure 13B:
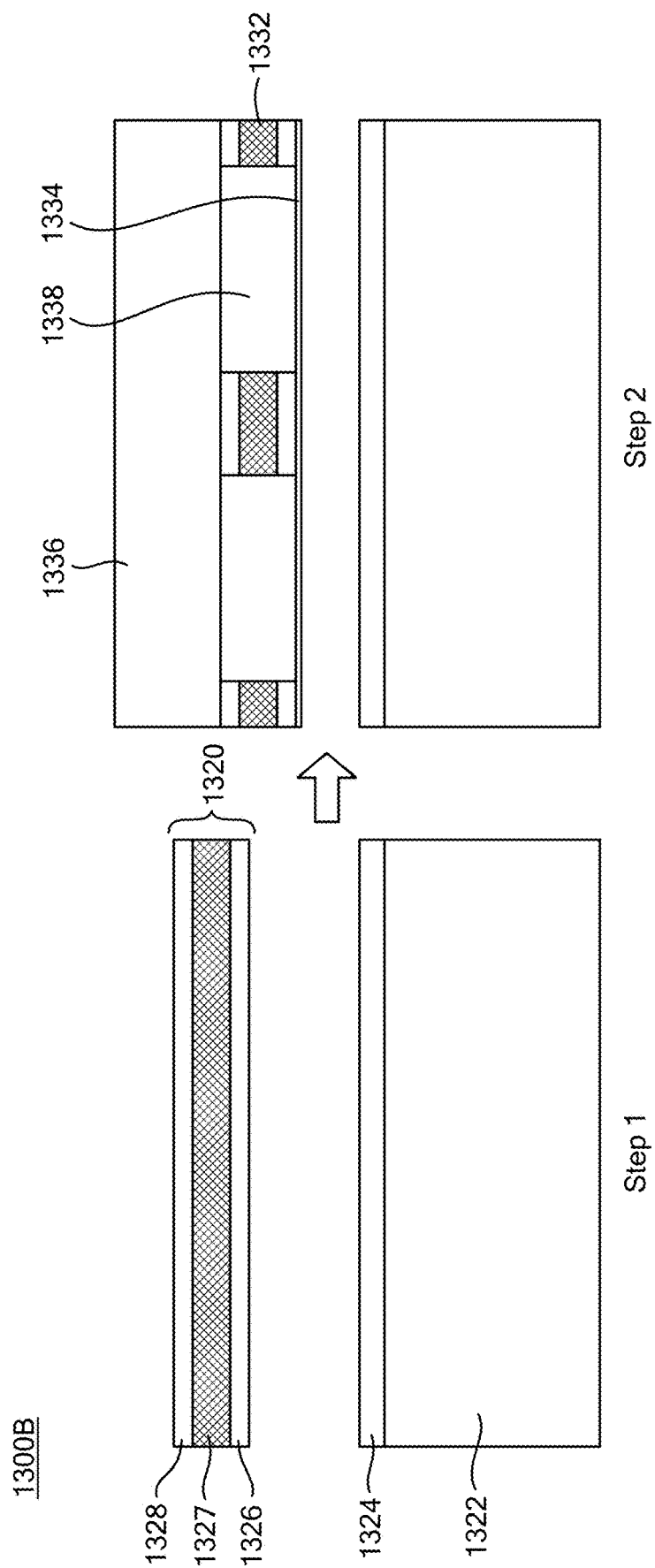
FIG. 13B shows a process for forming low-diffraction metal mesh patterns with low glint, in accordance with the present disclosure.

FIG. 13B illustrates an embodiment in which the methods of the present disclosure are used to provide low diffractive and low glint films based on the donor-receiver transfer processes described herein. In Step 1, donor sheet 1320 (shown in explode stacked view for clarity) is composed of three layers, 1326, 1327, 1328 formed on release layer 1324 of substrate 1322. The outer two (or one, for single sided glint reduction) layers 1326 and 1238 can be made of intrinsically low reflectivity metals (e.g., Cr, Ni, etc.; other low-reflectivity metals may additionally or alternatively be used), alloys (e.g., GeTeSb; other alloys may additionally or alternatively be used), dark metal inorganic layers, or other low reflectivity materials. Because core metal 1327 (e.g., Cu, Al, Au, Ag, etc.) is the main current carrier, the outside cladding materials can be thin conductors or non-conductors, where in the latter case the portions of the outer layers would preferably be removed to make electrical contact. In Step 2, 1330, a semi-transparent patterning tool (such as described previously) with anti-diffraction patterns such as those in FIG. 13A may be used to form anti-diffraction pattern 1332 (process not shown) embedded into to substrate 1336 with adhesive 1334.

Exemplary embodiments of the present disclosure may include or be directed to: methods for forming planar light extraction structures (PLESs); methods for forming PLES with embedded metal mesh patterns; structures of PLES with embedded metal mesh patterns; methods of dual extraction structures; methods of dual extraction with embedded metal mesh patterns; structures of dual system with embedded metal mesh patterns; methods of forming moisture/oxygen leakage-free polymeric structures; methods of forming smooth metal patterns without plasma etching (and, in some embodiments, non-metal patterns); and/or methods of diffraction-free plasma etch-free metal mesh (and, in some embodiments, non-metal meshes). among others.

Figure 14:
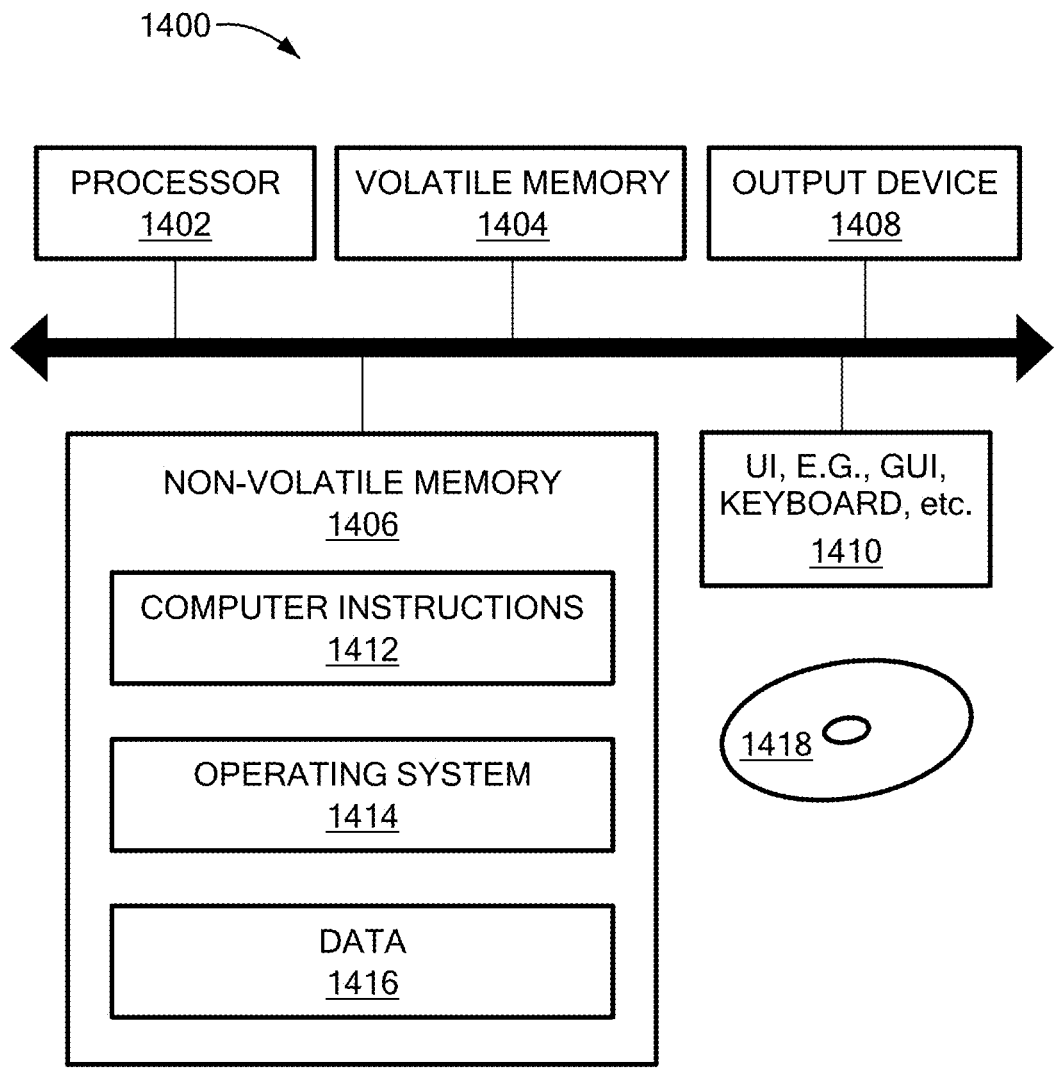
FIG. 14 is a schematic diagram of an example computer system that can perform or control all or at least a portion of processing, e.g., steps in the algorithms and methods, utilized for embodiments of the present disclosure.

FIG. 14 is a schematic diagram of an example computer system 1400 that can perform or control all or at least a portion of the processing, e.g., steps in the algorithms and methods, described herein. The computer system 1400 includes a processor 1402, a volatile memory 1404, a non-volatile memory 1406 (e.g., hard disk), an output device 1408 and a user input or interface (UI) 1410, e.g., graphical user interface (GUI), a mouse, a keyboard, a display, and/or any common user interface, etc. The non-volatile memory (non-transitory storage medium) 1406 stores computer instructions 1412 (a.k.a., machine-readable instructions or computer-readable instructions) such as software (computer program product), an operating system 1414 and data 1416. In one example, the computer instructions 1412 are executed by the processor 1402 out of (from) volatile memory 1404. In one embodiment, an article 1418 (e.g., a storage device or medium such as a hard disk, an optical disc, magnetic storage tape, optical storage tape, flash drive, etc.) includes or stores the non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), and optionally at least one input device, and one or more output devices. Program code may be applied to data entered using an input device or input connection (e.g., port or bus) to perform processing and to generate output information.

The system 1400 can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment.

A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate. Further, the terms "computer" or "computer system" may include reference to plural like terms, unless expressly stated otherwise.

Processing may be performed by one or more programmable processors executing one or more computer programs to perform the functions of the system. All or part of the system may be implemented as, special purpose logic circuitry, e.g., an FPGA (field programmable gate array) and/or an ASIC (application-specific integrated circuit).

Accordingly, embodiments of the inventive subject matter can afford various benefits relative to prior art techniques. For example, embodiments of the present disclosure can enable or provide higher device efficiency, more uniform light emission, larger area devices, greater device stability, and lower production costs, among others.

Various embodiments of the concepts, systems, devices, structures, and techniques sought to be protected are described above with reference to the related drawings. Alternative embodiments can be devised without departing from the scope of the concepts, systems, devices, structures, and techniques described. For example, variants used to produce substrates for top emitting OLEDS and for LED light extraction, structures for light capture in photovoltaic cells, structures for providing low reflectance/high transmissivity metal electrodes for photovoltaic cells and perovskite devices, low-diffraction metal electrodes for switchable (smart) windows, metal mesh electrodes on complex curved surfaces, conductive elements for biosensors, periodic structures for IR devices, among others.

It is noted that various connections and positional relationships (e.g., over, below, adjacent, etc.) may be used to describe elements in the description and drawing. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising, "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

Additionally, the term "exemplary" means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e., one, two, three, four, etc. The term "plurality" indicates any integer number greater than one. The term "connection" can include an indirect "connection" and a direct "connection".

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top", "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims. All publications and references cited in this patent are expressly incorporated by reference in their entirety.

What is claimed is:

1. A method for forming a substrate for controlling optical and/or electrical properties of electronic devices deposited thereupon, the method comprising:
 a) depositing a release layer as a first layer on a support substrate acting as a first substrate;
 b) forming on the release layer a second layer having a surface proximate to the release layer and a surface distal to the release layer, wherein the second layer has on the distal surface a patterned portion having an undulating pattern in a high refractive index transparent material, the undulating pattern being capable of directing light;
 c) forming a laminate by adhesively bonding a second substrate having moisture and oxygen barrier properties to the undulating pattern of the first substrate using a low refractive index transparent bonding material; and
 d) separating the laminate at the release layer to form on the second substrate a material stack comprising an upper planar surface of a planar high refractive index layer with a lower surface including the patterned portion and a next underlying low index material with an upper surface in conformal contact with the patterned portion and a lower surface bonded to the second substrate.

2. The method of claim 1, wherein the support substrate comprises a plastic film.

3. The method of claim 1, wherein the release layer comprises a low energy material such as a fluoropolymer compound, including PTFE (polytetrafluoroethylene) or silicone-based material.

4. The method of claim 1, wherein a transparent conductive layer is between the release layer and the second layer.

5. The method of claim 1, wherein the patterned portion comprises a periodic array with a pitch in the range of 200 nm to 100 microns and a height in the range of 100 nm to 100 microns.

6. The method of claim 5, wherein the undulating surface comprises an aspect ratio of height-to-pitch of the undulating surface that ranges from about 1-to-10 to about 10-to-1.

7. The method of claim 1, wherein the pattern comprises periodic or non-periodic structures have positive or negative relief shapes.

8. The method of claim 1, wherein the second substrate comprises rigid or flexible glass, and an adhesion promoting layer.

9. The method of claim 1, wherein the second substrate comprises a barrier-coated polymer film.

10. The method of claim 1, wherein one or more steps are carried out by roll-to-roll processes.

11. A method of forming a substrate for controlling optical and/or electrical properties of electronic devices deposited thereupon, the method comprising:
  a. depositing a release layer on a support substrate;
  b. depositing a first conductive layer onto the support substrate, wherein the first conductive layer comprises a transparent material;
  c. depositing a second conductive layer onto the first conductive layer;
  d. forming a polymer mask having open areas on the second conductive layer on the electrically conductive layer;
  e. forming an electrically conductive pattern by selective removal of material from the second conductive layer through the open areas of the polymer mask;
  f. forming over the electrically conductive pattern an undulating surface in a high refractive index transparent material, the undulating surface being capable of directing light;
  g. forming a laminate by adhesively bonding a second substrate having moisture and oxygen barrier properties to the undulating surface of the first substrate using a low refractive index transparent bonding material; and
  h. separating the laminate at the release layer to form on the second substrate a material stack comprising the undulating surface.

12. The method of claim 11, wherein the electrically conductive layer comprises a metal.

13. The method of claim 12, wherein the metal comprises one or more of Cu, Al, Ag, Au, Mo, and Ni.

14. The method of claim 11, wherein the material stack comprises an upper planar patterned metal layer embedded in a high refractive index layer with a lower surface comprising the undulating surface, and a next underlying low index material with an upper surface in conformal contact with the overlying undulating surface and a lower surface bonded to the second substrate.

15. The method of claim 11, wherein the release layer comprises a fluoropolymer compound.

16. The method of claim 11, wherein forming the polymer mask comprises using a semitransparent imprint tool.

17. The method of claim 11, wherein removal of material from the electrically conductive layer comprises wet etching.

18. The method of claim 11, wherein the support substrate comprises a polymer film.

19. The method of claim 11, wherein the second substrate comprises rigid or flexible glass.

20. The method of claim 19, further comprising forming an adhesion promoting layer on the glass substrate.

21. The method of claim 11, wherein one or more steps are carried out by roll-to-roll processes.

* * * * *